US011349237B2

(12) United States Patent
Blackburn et al.

(10) Patent No.: US 11,349,237 B2
(45) Date of Patent: May 31, 2022

(54) CARD EDGE CONNECTOR

(71) Applicant: TE Connectivity Services GmbH, Schaffhausen (CH)

(72) Inventors: Christopher William Blackburn, Bothell, WA (US); John Eugene Westman, Harrisburg, PA (US); Michael Eugene Shirk, Grantville, PA (US); Michael David Herring, Apex, NC (US); Zachary Galbraith, Hummelstown, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 0 days.

(21) Appl. No.: 17/177,669

(22) Filed: Feb. 17, 2021

(65) Prior Publication Data
US 2021/0265754 A1 Aug. 26, 2021

Related U.S. Application Data

(60) Provisional application No. 62/980,770, filed on Feb. 24, 2020.

(51) Int. Cl.
*H01R 12/72* (2011.01)
*H01R 12/57* (2011.01)
*H01R 13/631* (2006.01)
*H01R 13/627* (2006.01)
*H01R 107/00* (2006.01)
*H01R 24/60* (2011.01)
*H05K 1/11* (2006.01)

(52) U.S. Cl.
CPC ........... *H01R 12/727* (2013.01); *H01R 12/57* (2013.01); *H01R 12/721* (2013.01); *H01R 13/6272* (2013.01); *H01R 13/631* (2013.01); *H01R 24/60* (2013.01); *H01R 2107/00* (2013.01); *H05K 1/117* (2013.01)

(58) Field of Classification Search
CPC ............ H01R 23/7075; H01R 23/7084; H01R 23/7078; H01R 12/727; H01R 12/57; H01R 12/721; H01R 13/631; H01R 13/6272; H01R 2107/00; H01R 24/60; H05K 1/117
USPC ............................................... 439/630, 541.5
See application file for complete search history.

(56) References Cited

U.S. PATENT DOCUMENTS

| 7,226,311 | B2 * | 6/2007 | Sugita | .................. | H01R 12/714 439/541.5 |
| 7,931,495 | B2 * | 4/2011 | Zhu | ...................... | H01R 12/721 439/541.5 |
| 8,740,643 | B2 * | 6/2014 | Kuang | ................. | H01R 12/721 439/541.5 |
| 10,374,341 | B1 * | 8/2019 | Phillips | ................ | H01R 12/721 |

(Continued)

*Primary Examiner* — Gary F Paumen

(57) ABSTRACT

A card edge connector includes a housing having upper and lower card slots receiving upper and lower module circuit cards of a pluggable module. The card edge connector includes a contact assembly having a contact positioner holding upper and lower contacts. A guide feature guides mating of the contact assembly in the housing. A latching feature latchably secures the contact assembly to the housing. The upper contacts are arranged in first and second upper contact arrays. The lower contacts are arranged in first and second lower contact arrays. Contact tails of the upper and lower contacts are positioned at the bottom of the housing for surface mounting to the host circuit board.

21 Claims, 12 Drawing Sheets

(56) References Cited

U.S. PATENT DOCUMENTS

| | | | |
|---|---|---|---|
| 10,403,565 B1* | 9/2019 | Henry | H01L 23/49517 |
| 10,553,971 B1 | 2/2020 | Phillips et al. | |
| 10,855,020 B1* | 12/2020 | Phillips | H01R 12/721 |
| 2012/0225585 A1* | 9/2012 | Lee | H01R 13/6474 |
| | | | 439/626 |
| 2013/0034994 A1* | 2/2013 | Kuang | H01R 13/514 |
| | | | 439/607.22 |
| 2021/0367361 A1* | 11/2021 | Phillips | H01R 12/724 |

* cited by examiner

CARD EDGE CONNECTOR

CROSS REFERENCE TO RELATED APPLICATIONS

This application claims benefit to U.S. Provisional Application No. 62/980,770, filed 24 Feb. 2020, titled "CARD EDGE CONNECTOR", the subject matter of which is herein incorporated by reference in its entirety.

BACKGROUND OF THE INVENTION

The subject matter herein relates generally to card edge connectors of communication systems.

Some communication systems utilize communication connectors, such as card edge connectors to interconnect various components of the system for data communication. Some known communication systems use pluggable modules, such as I/O modules or circuit cards, which are electrically connected to the card edge connectors. The pluggable modules have module circuit cards having card edges that are mated with the card edge connectors during the mating operation. Each card edge connector typically has an upper row of contacts and a lower row of contact for mating with the corresponding circuit board. There is a need for connectors and circuit boards of communication systems to have greater contact density and/or data throughput. However, increasing density of contacts in the card edge connector leads to problems with cross-talk and signal integrity. Additionally, precise locating of high numbers of contacts in a connector is difficult.

A need remains for a reliable card edge connector having high density.

BRIEF DESCRIPTION OF THE INVENTION

In one embodiment, a card edge connector for mating with a pluggable module is provided. The card edge connector includes a housing including a top and a bottom. The housing has a front and a rear. The housing has a first side and a second side. The bottom is configured to be mounted to a host circuit board. The housing includes a cavity. The housing includes an upper card slot open to the cavity at the front of the housing and a lower card slot open to the cavity at the front of the housing. The upper card slot is configured to receive a card edge of an upper module circuit card of the pluggable module. The lower card slot is configured to receive a card edge of a lower module circuit card of the same pluggable module. The card edge connector includes a contact assembly received in the cavity. The contact assembly has a contact positioner holding an upper contact set of upper contacts and a lower contact set of lower contacts. The contact positioner includes a guide feature to guide mating of the contact assembly in the cavity of the housing. The contact positioner includes a latching feature configured to be latchably secured to the housing to secure the contact assembly in the cavity of the housing. The upper contact set has a first upper contact array of the upper contacts and a second upper contact array of the upper contacts. The upper contacts include upper intermediate portions extending between upper mating beams and upper contact tails. The upper mating beams of the upper contacts of the first and second upper contact arrays re arranged on opposite sides of the upper card slot for mating with upper and lower surfaces of the upper module circuit card. The upper contact tails are positioned at the bottom of the housing for termination to the host circuit board. The lower contact set has a first lower contact array of the lower contacts and a second lower contact array of the lower contacts. The lower contacts include lower intermediate portions extending between lower mating beams and lower contact tails. The lower mating beams of the lower contacts of the first and second lower contact arrays are arranged on opposite sides of the lower card slot for mating with upper and lower surfaces of the lower module circuit card. The lower contact tails are positioned at the bottom of the housing for termination to the host circuit board. The upper contact tails and the lower contact tails are coplanar for surface mounting to the host circuit board.

In another embodiment, a card edge connector for mating with a pluggable module is provided. The card edge connector includes a housing including a top and a bottom. The housing has a front and a rear. The housing has a first side and a second side. The bottom is configured to be mounted to a host circuit board. The housing includes a cavity. The housing includes an upper card slot open to the cavity at the front of the housing and a lower card slot open to the cavity at the front of the housing. The upper card slot is configured to receive a card edge of an upper module circuit card of the pluggable module. The lower card slot is configured to receive a card edge of a lower module circuit card of the same pluggable module. The card edge connector includes a contact assembly having a contact positioner holding an upper contact set of upper contacts and a lower contact set of lower contacts. The contact positioner is received in the cavity of the housing to position the upper contacts and the lower contacts for mating with the upper module circuit card and the lower module circuit card, respectively. The upper contact set has a first upper contact array of the upper contacts and a second upper contact array of the upper contacts. The upper contacts include upper intermediate portions extending between upper mating beams and upper contact tails. The upper mating beams of the upper contacts of the first and second upper contact arrays are arranged on opposite sides of the upper card slot for mating with upper and lower surfaces of the upper module circuit card. The upper contact tails are positioned at the bottom of the housing for termination to the host circuit board. The lower contact set has a first lower contact array of the lower contacts and a second lower contact array of the lower contacts. The lower contacts include lower intermediate portions extending between lower mating beams and lower contact tails. The lower mating beams of the lower contacts of the first and second lower contact arrays are arranged on opposite sides of the lower card slot for mating with upper and lower surfaces of the lower module circuit card. The lower contact tails are positioned at the bottom of the housing for termination to the host circuit board. The upper contact tails and the lower contact tails are coplanar for surface mounting to the host circuit board. The upper contact tails of the first upper contact array are rearward facing and the lower contact tails of the second lower contact array are forward facing.

In a further embodiment, a card edge connector for mating with a pluggable module is provided. The card edge connector includes a housing including a top and a bottom. The housing has a front and a rear. The housing has a first side and a second side. The bottom is configured to be mounted to a host circuit board. The housing includes a cavity. The housing includes an upper card slot open to the cavity at the front of the housing and a lower card slot open to the cavity at the front of the housing. The upper card slot is separated from the lower card slot by a divider wall. The upper card slot is configured to receive a card edge of an upper module circuit card of the pluggable module. The lower card slot is configured to receive a card edge of a lower module circuit card of the same pluggable module. The card edge connector includes a contact assembly having a contact positioner holding an upper contact set of upper contacts and a lower contact set of lower contacts. The contact positioner is received in the cavity of the housing to position the upper contacts and the lower contacts for mating with the upper module circuit card and the lower module circuit card, respectively. The upper contacts include upper high speed transmit contacts, upper high speed receive contacts, upper low speed sideband contacts, and upper ground contacts. The lower contacts include lower high speed transmit contacts, lower high speed receive contacts, lower low speed sideband contacts, and lower ground contacts. The upper contact set has a first upper contact array of the upper contacts and a second upper contact array of the upper contacts. The upper contacts include upper intermediate portions extending between upper mating beams and upper contact tails. The upper mating beams of the upper contacts of the first and second upper contact arrays are arranged on opposite sides of the upper card slot for mating with upper and lower surfaces of the upper module circuit card. The upper contact tails are positioned at the bottom of the housing for termination to the host circuit board. The lower contact set has a first lower contact array of the lower contacts and a second lower contact array of the lower contacts. The lower contacts include lower intermediate portions extending between lower mating beams and lower contact tails. The lower mating beams of the lower contacts of the first and second lower contact arrays are arranged on opposite sides of the lower card slot for mating with upper and lower surfaces of the lower module circuit card. The lower contact tails are positioned at the bottom of the housing for termination to the host circuit board. The upper contact tails and the lower contact tails are coplanar for surface mounting to the host circuit board. The upper high speed transmit contacts are arranged in pairs with the upper ground contacts arranged therebetween. The upper high speed receive contacts are arranged in pairs with the upper ground contacts arranged therebetween. The lower high speed transmit contacts are arranged in pairs with the lower ground contacts arranged therebetween. The lower high speed receive contacts are arranged in pairs with the lower ground contacts arranged therebetween. The upper high speed transmit contacts are provided at a first side of the contact positioner and the upper high speed receive contacts are provided at a second side of the contact positioner with at least one of the upper low speed sideband contacts located between the upper high speed transmit contacts and the upper high speed receive contacts. The lower high speed transmit contacts are provided at the second side of the contact positioner and the lower high speed receive contacts are provided at the first side of the contact positioner with at least one of the lower low speed sideband contacts located between the lower high speed transmit contacts and the lower high speed receive contacts.

DETAILED DESCRIPTION OF THE INVENTION

Figure 1:
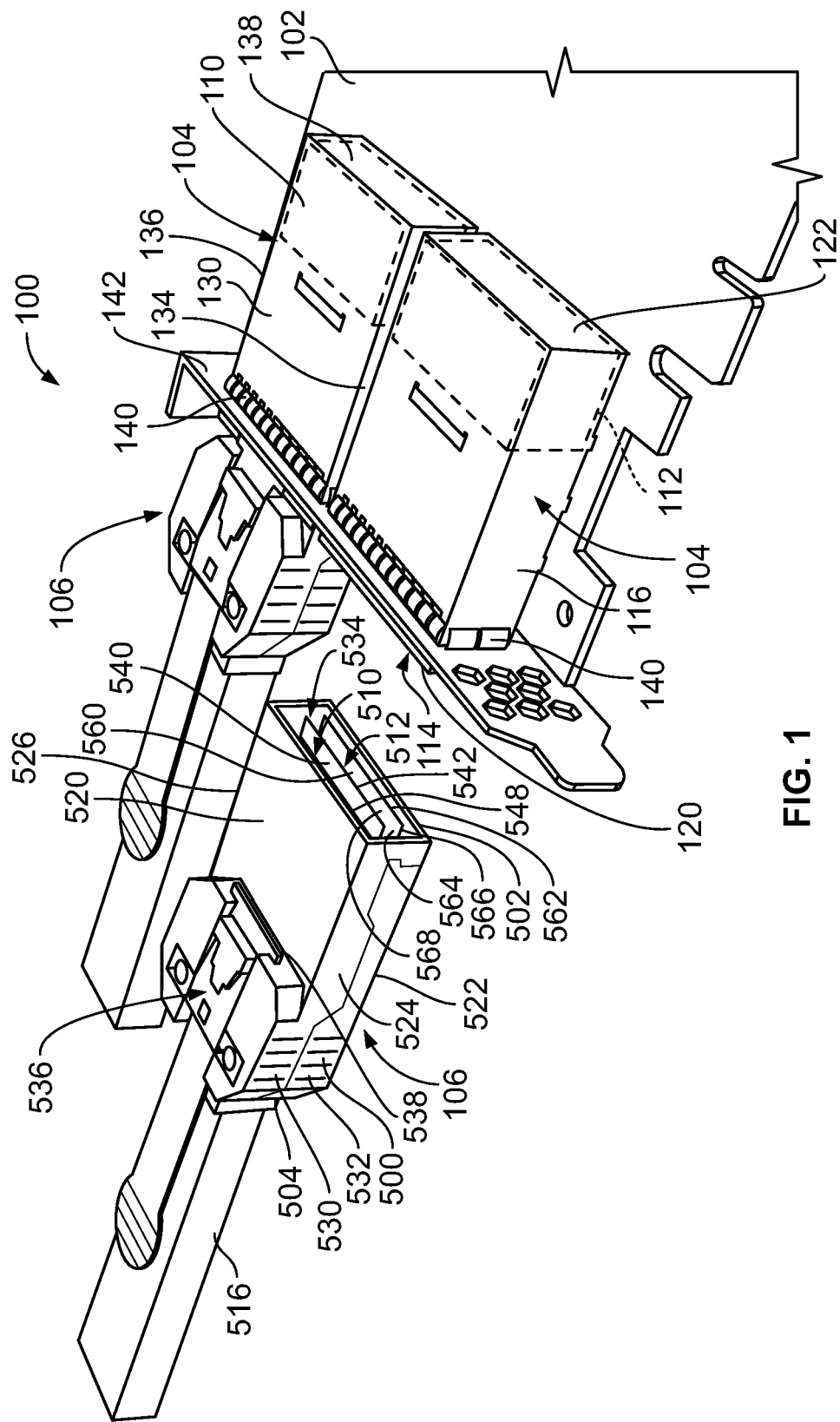
FIG. 1 is a front perspective view of a communication system formed in accordance with an exemplary embodiment.
Figure 2:
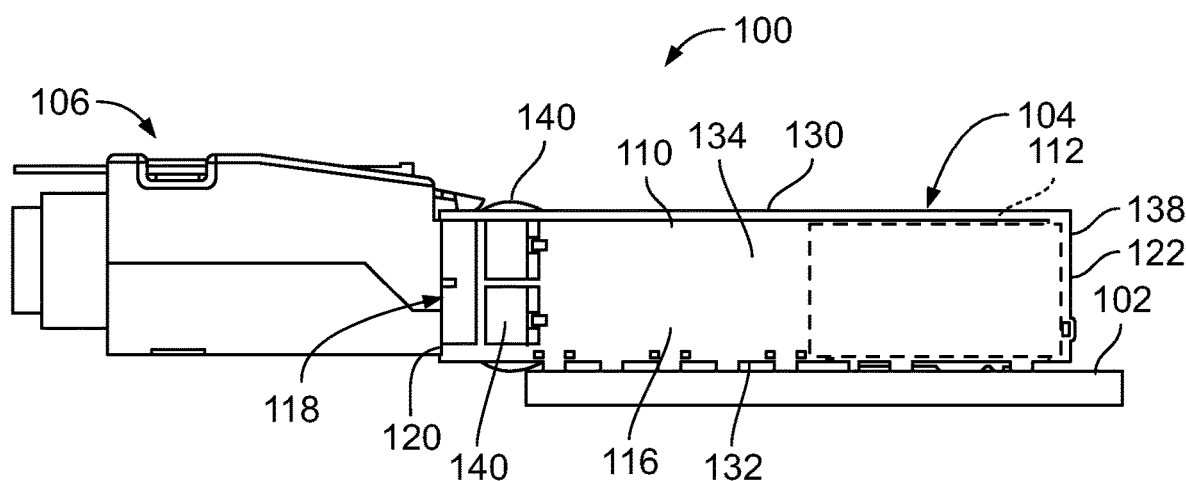
FIG. 2 is a side view of the communication system formed in accordance with an exemplary embodiment.
Figure 3:
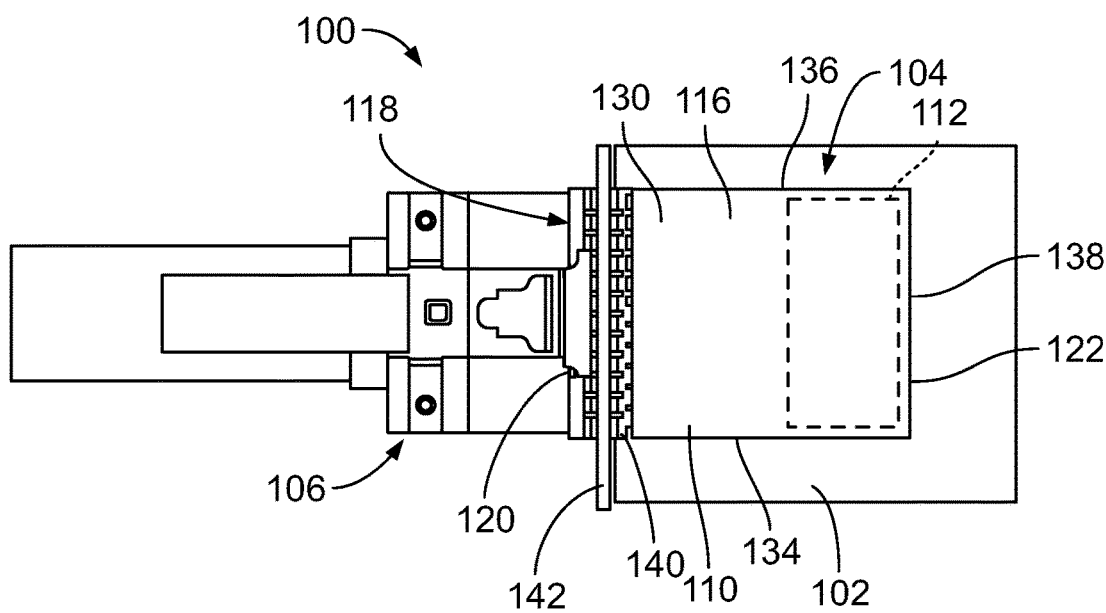
FIG. 3 is a top view of the communication system formed in accordance with an exemplary embodiment.

FIG. 1 is a front perspective view of a communication system 100 formed in accordance with an exemplary embodiment. FIG. 2 is a side view of the communication system 100 formed in accordance with an exemplary embodiment. FIG. 3 is a top view of the communication system 100 formed in accordance with an exemplary embodiment. The communication system includes a host circuit board 102 and one or more receptacle connector assemblies 104 mounted to the host circuit board 102 (FIG.

1 illustrates multiple receptacle connector assemblies 104 and FIG. 3 illustrates a single receptacle connector assembly 104). A pluggable module 106 is configured to be electrically connected to each receptacle connector assembly 104. The pluggable module 106 is electrically connected to the host circuit board 102 through the receptacle connector assembly 104.

In an exemplary embodiment, the receptacle connector assembly 104 includes a receptacle cage 110 and a card edge connector 112 (shown with phantom lines). The receptacle cage 110 forms a cavity 114 that receives the card edge connector 112 and the pluggable module 106. In various embodiments, the receptacle cage 110 is enclosed and provides electrical shielding for the card edge connector 112 and the pluggable module 106. In an exemplary embodiment, the receptacle cage 110 is a shielding, stamped and formed cage member that includes a plurality of shielding walls 116 that define the cavity 114. In other various embodiments, the card edge connector 112 may be located rearward of the receptacle cage 110. In other embodiments, the receptacle cage 110 may be open between frame members to provide cooling airflow for the pluggable module 106. In the illustrated embodiment, the card edge connector 112 is oriented for horizontal mating (for example, parallel to the host circuit board 102). In other various embodiments, the card edge connector 112 is oriented for vertical mating (for example, perpendicular to the host circuit board 102).

In the illustrated embodiment, the receptacle cage 110 is a single port receptacle cage configured to receive a single pluggable module 106. In other various embodiments, the receptacle cage 110 may be a ganged cage member having a plurality of ports ganged together in a single row and/or a stacked cage member having multiple ports stacked as an upper port and a lower port for receiving corresponding pluggable modules 106. The receptacle cage 110 includes a module channel 118 having a module port open to the module channel 118. The module channel 118 receives the pluggable module 106 through the module port. In an exemplary embodiment, the receptacle cage 110 extends between a front end 120 and a rear end 122. The module port is provided at the front end 120. Any number of module channels 118 may be provided in various embodiments arranged in a single column or in multiple columns (for example, 2×2, 3×2, 4×2, 4×3, 4×1, 2×1, and the like). Optionally, multiple card edge connectors 112 may be arranged within the receptacle cage 110, such as when multiple rows and/or columns of module channels 118 are provided.

Figure 4:
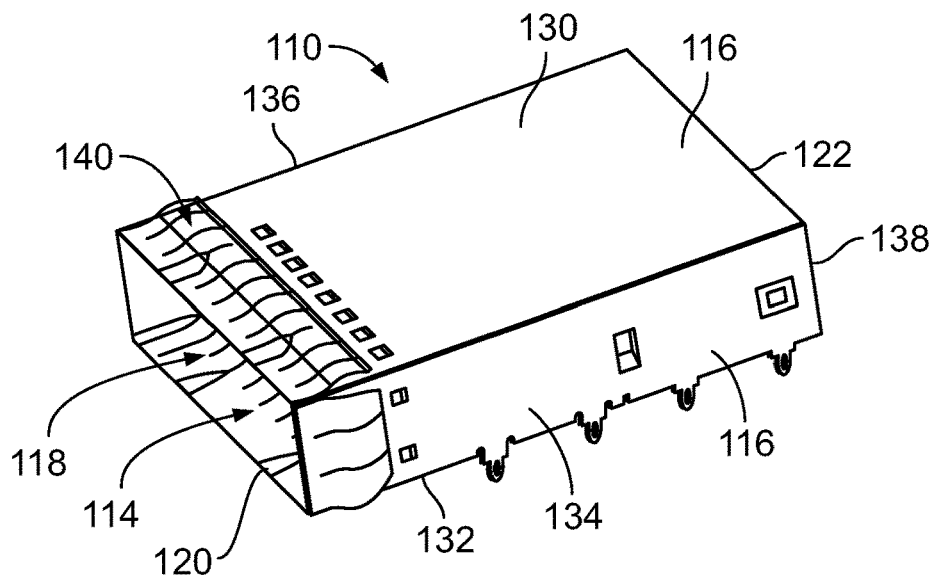
FIG. 4 is a front perspective view of a receptacle cage of a receptacle connector assembly of the communication system in an exemplary embodiment.

With additional reference to FIG. 4, which is a front perspective view of the receptacle cage 110 of the receptacle connector assembly 104, in an exemplary embodiment, the walls 116 of the receptacle cage 110 include a top wall 130, a bottom wall 132, a first side wall 134 and a second side wall 136 extending from the top wall 130. The bottom wall 132 may rest on the host circuit board 102. In other various embodiments, the receptacle cage 110 may be provided without the bottom wall 132. Optionally, the walls 116 of the receptacle cage 110 may include a rear wall 138 at the rear end 122. The walls 116 define the cavity 114. For example, the cavity 114 may be defined by the top wall 130, the bottom wall 132, the side walls 134, 136 and the rear wall 138. In various embodiments, the cavity 114 receives the card edge connector 112 at the rear end 122. Other walls 116 may separate or divide the cavity 114 into additional module channels 118, such as in embodiments using ganged and/or stacked receptacle cages. For example, the walls 116 may include one or more vertical divider walls and/or one or more horizontal divider walls between the module channels 118.

In an exemplary embodiment, the receptacle cage 110 may include one or more gaskets 140 at the front end 120 for providing electrical shielding for the module channels 118. For example, the gaskets 140 may be provided at the port to electrically connect the receptacle cage 110 with the pluggable modules 106 received in the module channel 118. The gaskets 140 electrically connect the receptacle cage 110 to a panel 142 (shown in FIG. 1). The gaskets 140 are provided around the exterior of the receptacle cage 110 for interfacing with the panel 142, such as when the front end 120 of the receptacle cage 110 extends through a cutout in the panel 142. The gaskets 140 may include spring fingers or other deflectable features that are configured to be spring biased against the panel 142 to create an electrical connection with the panel 142.

Optionally, the receptacle connector assembly 104 may include one or more heat sinks (not shown) for dissipating heat from the pluggable modules 106. For example, the heat sink may be coupled to the top wall 130 for engaging the pluggable module 106 received in the module channel 118. The heat sink may extend through an opening in the top wall 130 to directly engage the pluggable module 106. Other types of heat sinks may be provided in alternative embodiments.

Figure 5:
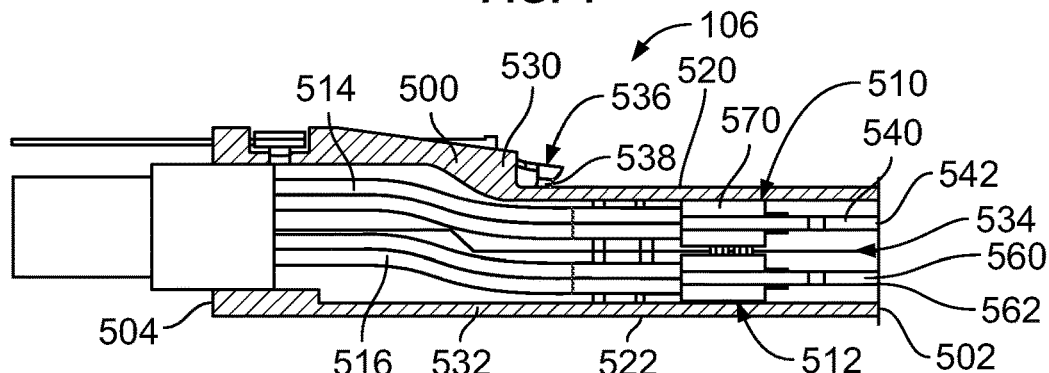
FIG. 5 is a cross-sectional view of a pluggable module of the communication system in an exemplary embodiment.

With additional reference to FIG. 5, which is a cross-sectional view of the pluggable module 106, in an exemplary embodiment, the pluggable module 106 is a dual circuit card module. The pluggable module 106 includes a cable assembly, such as an upper cable assembly 510 and a lower cable assembly 512. The upper cable assembly 510 includes upper cables 514. The lower cable assembly 512 includes lower cables 516. The upper cable assembly 510 includes an upper module circuit card 540. The lower cable assembly 512 includes a lower module circuit card 560.

The pluggable module 106 includes a pluggable body 500 holding the upper and lower cable assemblies 510, 512. The pluggable body 500 is defined by one or more shells. The pluggable body 500 may be thermally conductive and/or may be electrically conductive, such as to provide EMI shielding for the upper and lower cable assemblies 510, 512. The pluggable body 500 includes a mating end 502 and an opposite cable end 504. The mating end 502 is configured to be inserted into the corresponding module channel 118. The cable end 504 has the cables 514, 516 extending therefrom, which may be routed to another component or another pluggable module 106 within the communication system 100.

The pluggable module 106 includes an outer perimeter defining an exterior of the pluggable body 500. For example, the outer perimeter may be defined by a top 520, a bottom 522, a first side 524 and a second side 526. The pluggable body 500 may have other shapes in alternative embodiments. In an exemplary embodiment, the pluggable body 500 provides heat transfer for components of the pluggable module 106. In an exemplary embodiment, the pluggable body 500 includes an upper shell 530 and a lower shell 532. The upper and lower shells 530, 532 are joined, such as along the sides 524, 526. The upper and lower shells 530, 532 may be die cast shells. In alternative embodiments, the upper and lower shells 530, 532 may be stamped and formed shells. The upper and lower shells 530, 532 define a cavity 534. The cavity 534 may be defined by the top 520, the bottom 522, the first side 524 and the second side 526.

In an exemplary embodiment, the pluggable module 106 includes a latch 536 for securing the pluggable module 106 to the receptacle cage 110. The latch 536 includes one or more latching fingers 538 configured to be latchably secured to the receptacle cage 110. In various embodiments, the latch 536 includes a pull tab for actuating the latch 536. The latch 536 may be actuated by other devices in alternative embodiments. In the illustrated embodiment, the latch 536 is provided at the top 520; however, the latch 536 may be provided at other locations, such as the bottom 522 or the sides 524, 526.

In an exemplary embodiment, the latch 536 is located along the exterior of the pluggable body 500. However, portions of the latch 536 may be located interior of the pluggable body 500 in other various embodiments. The latching fingers 538 may be coupled to the exterior of the receptacle cage 110 in various embodiments, such as to reduce the overall height of the receptacle cage 110. In the illustrated embodiment, the latching fingers 538 face the top 520. The pluggable module 106 receives the top cage wall 130 of the receptacle cage 110 between the latch 536 and the top cage wall 130. The latching fingers 538 are loaded into latching features, such as openings in the cage wall 130, from exterior of the module channel 118 to engage the exterior of the receptacle cage 110. For example, the latch is deflectable away from the receptacle cage 110 to release the latching fingers 538 from the receptacle cage 110.

In an exemplary embodiment, the pluggable module 106 is a dual circuit card module. The pluggable module 106 includes an upper module circuit card 540 and a lower module circuit card 560. The upper and lower module circuit cards 540, 560 are received in the cavity 534 of the pluggable body 500. The upper and lower module circuit cards 540, 560 are configured to be communicatively coupled to the card edge connector 112. The upper and lower module circuit cards 540, 560 are accessible at the mating end 502.

Figure 6:
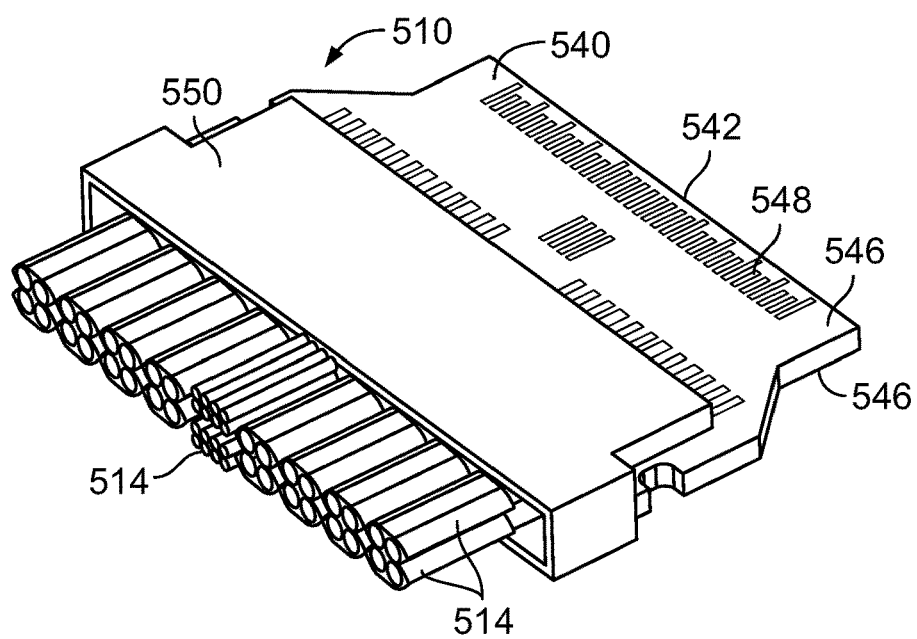
FIG. 6 is a rear perspective view of a portion of the pluggable module in an exemplary embodiment.

With additional reference to FIG. 6, which is a rear perspective view of a portion of the pluggable module 106, in an exemplary embodiment, the upper cable assembly 510 includes a holder 550 holding the upper module circuit card 540 and the cables 514 associated with the upper module circuit card 540. The holder 550 is a dielectric holder, such as being manufactured from a plastic material. The holder 550 may be formed in place on the upper module circuit card 540. For example, the holder 550 may be molded in situ on the upper module circuit card 540. The holder 550 may be molded around the cables 514 to provide strain relief for the cables 514. In other embodiments, the holder 550 may be separately manufactured and the upper module circuit card 540 may be inserted into the holder 550. The holder 550 is received in the pluggable body 500. The holder 550 may be used to position the upper module circuit card 540 in the cavity 534. For example, the holder 550 may be used to position the upper module circuit card 540 relative to the lower module circuit card 560.

The upper module circuit card 540 has a card edge 542 extending between a first or upper surface 544 and a second or lower surface 546 at a mating end of the upper module circuit card 540. The upper module circuit card 540 includes upper contact pads 548, such as pads or circuits, at the card edge 542 configured to be mated with the card edge connector 112. In an exemplary embodiment, the contact pads 548 are provided on the upper surface 544 and the lower surface 546. The upper module circuit card 540 may include components, circuits and the like used for operating and or using the pluggable module 106. For example, the upper module circuit card 540 may have conductors, traces, pads, electronics, sensors, controllers, switches, inputs, outputs, and the like to form various circuits. The cables 514 are terminated to the upper module circuit card 540.

With reference back to FIGS. 1 and 5, the lower cable assembly 512 may be similar to the upper cable assembly 510. In various embodiments, the lower cable assembly 512 may be identical to the lower cable assembly 512. The lower cable assembly 512 includes a holder 570 holding the lower module circuit card 560 and the cables 516 associated with the lower module circuit card 560. The holder 570 is received in the pluggable body 500. The holder 570 may be used to position the lower module circuit card 560 in the cavity 534. For example, the holder 570 may be used to position the lower module circuit card 560 relative to the upper module circuit card 540.

The lower module circuit card 560 has a card edge 562 extending between a first or upper surface 564 and a second or lower surface 566 at a mating end of the lower module circuit card 560. The lower module circuit card 560 includes lower contact pads 568, such as pads or circuits, at the card edge 562 configured to be mated with the card edge connector 112. In an exemplary embodiment, the contact pads 568 are provided on the upper surface 564 and the lower surface 566. The lower module circuit card 560 may include components, circuits and the like used for operating and or using the pluggable module 106. For example, the lower module circuit card 560 may have conductors, traces, pads, electronics, sensors, controllers, switches, inputs, outputs, and the like to form various circuits. The cables 516 are terminated to the lower module circuit card 560.

Figure 7:
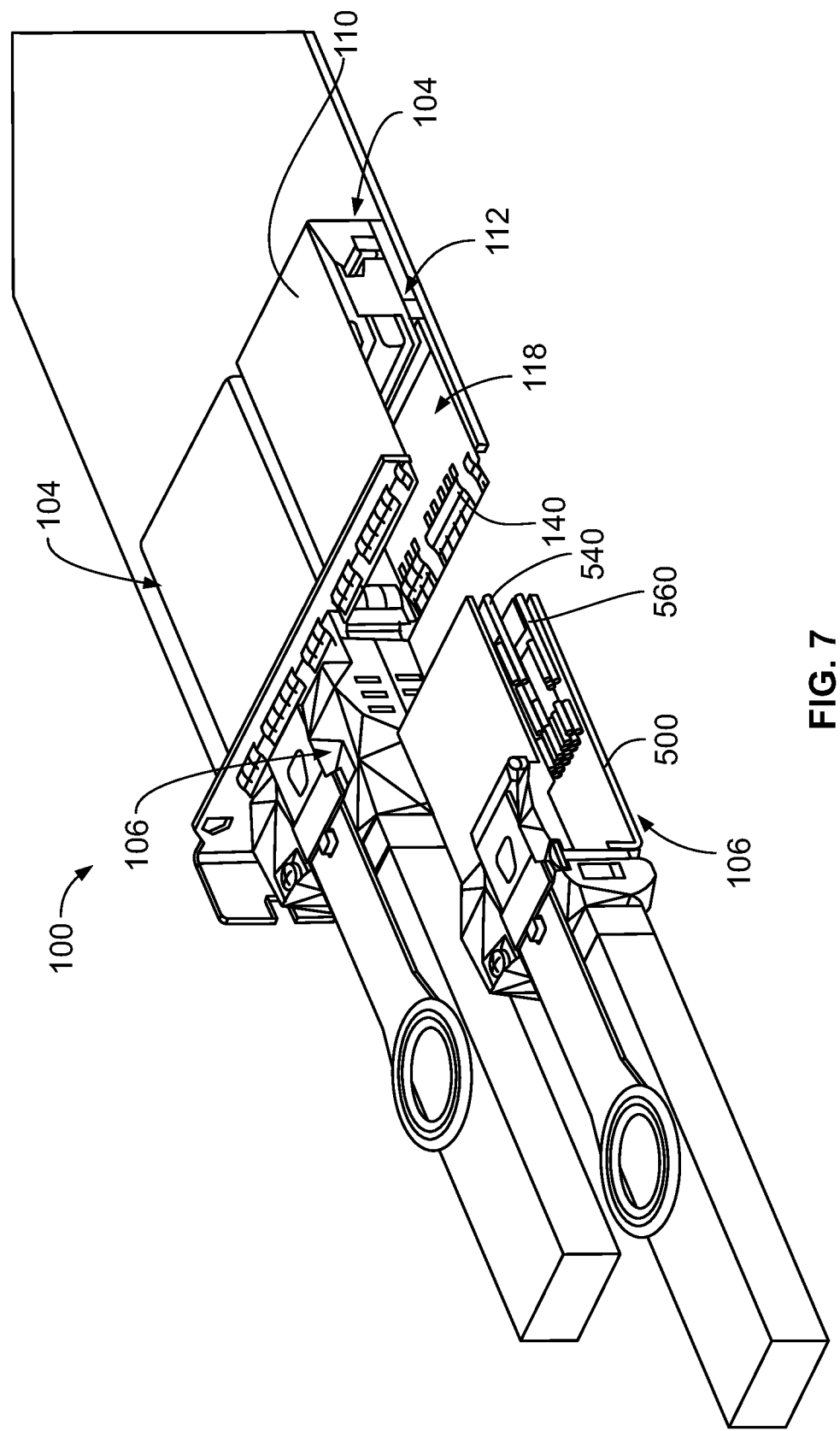
FIG. 7 is a partial sectional view of the communication system in accordance with an exemplary embodiment.

FIG. 7 is a partial sectional view of the communication system 100 in accordance with an exemplary embodiment. FIG. 7 illustrates one of the pluggable modules 106 poised for mating with the receptacle connector assembly 104. The pluggable module 106 is aligned with the module channel 118 of the receptacle cage 110. The receptacle cage 110 is configured to be electrically connected to the pluggable body 500 using the gaskets 140. The upper and lower module circuit cards 540, 560 are configured to be mated with the card edge connector 112. The upper and lower module circuit cards 540, 560 are configured to be loaded into corresponding card slots at the mating end of the card edge connector 112.

Figure 8:
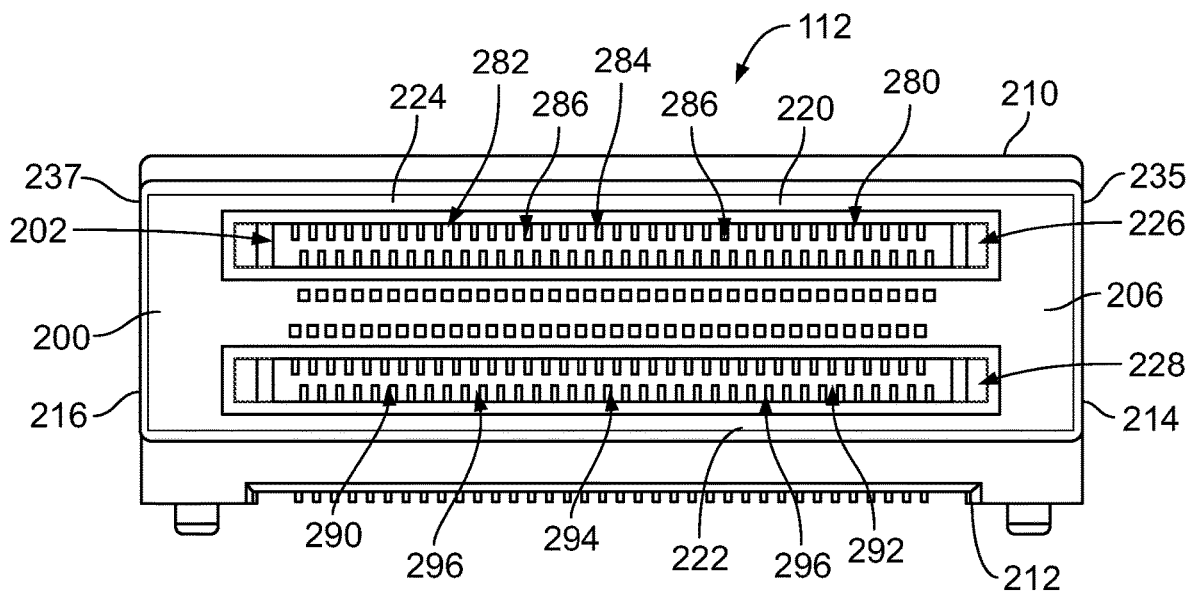
FIG. 8 is a front view of a card edge connector of the receptacle connector assembly in accordance with an exemplary embodiment.
Figure 9:
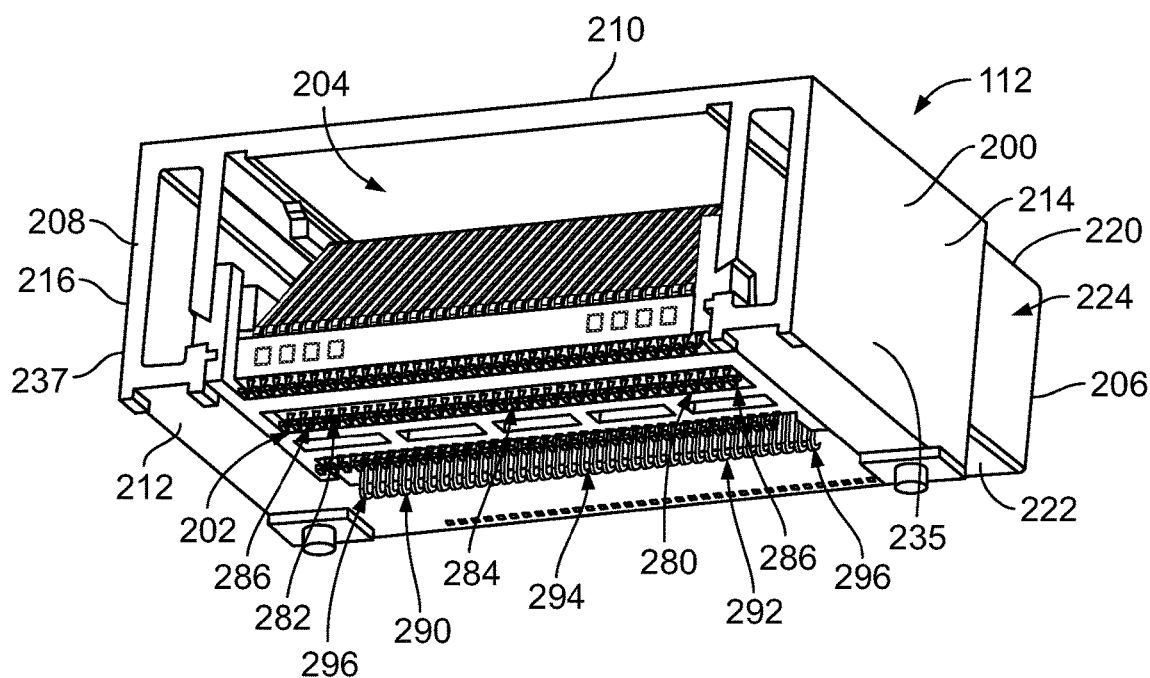
FIG. 9 is a bottom perspective view of the card edge connector in accordance with an exemplary embodiment.

FIG. 8 is a front view of the card edge connector 112 in accordance with an exemplary embodiment. FIG. 9 is a bottom perspective view of the card edge connector 112 in accordance with an exemplary embodiment. The card edge connector 112 includes an outer housing 200 having a contact assembly 202 received in a cavity 204 of the outer housing 200. The outer housing 200 extends between a front 206 and a rear 208. The outer housing 200 extends between a top 210 and a bottom 212. The outer housing 200 extends between opposite first and second sides 214, 216. The outer housing 200 may be generally box shaped in various embodiments. In the illustrated embodiment, the bottom 212 defines a mounting end configured to be mounted to the host circuit board 102 (shown in FIG. 1) and the front 206 defines the mating end configured to be mated with the pluggable module 106 (shown in FIG. 1). Other orientations are possible in alternative embodiments.

The outer housing 200 includes a top wall 220 at the top 210 and a bottom wall 222 at the bottom 212. In the illustrated embodiment, the outer housing 200 includes a shroud 224 at the front 206 configured to be mated with the pluggable module 106. The shroud 224 is configured to be received in the pluggable module 106. The outer housing 200 includes an upper card slot 226 and a lower card slot 228 at the front 206. The card slots 226, 228 are open at the front 206 to receive the upper and lower module circuit cards 540, 560 (shown in FIG. 1), respectively. The card slots 226, 228 receive the card edges 542, 544 of the module circuit cards 540, 560. The upper and lower module circuit cards 540, 560 interface with the contact assembly 202 in the card slots 226, 228.

Figure 10:
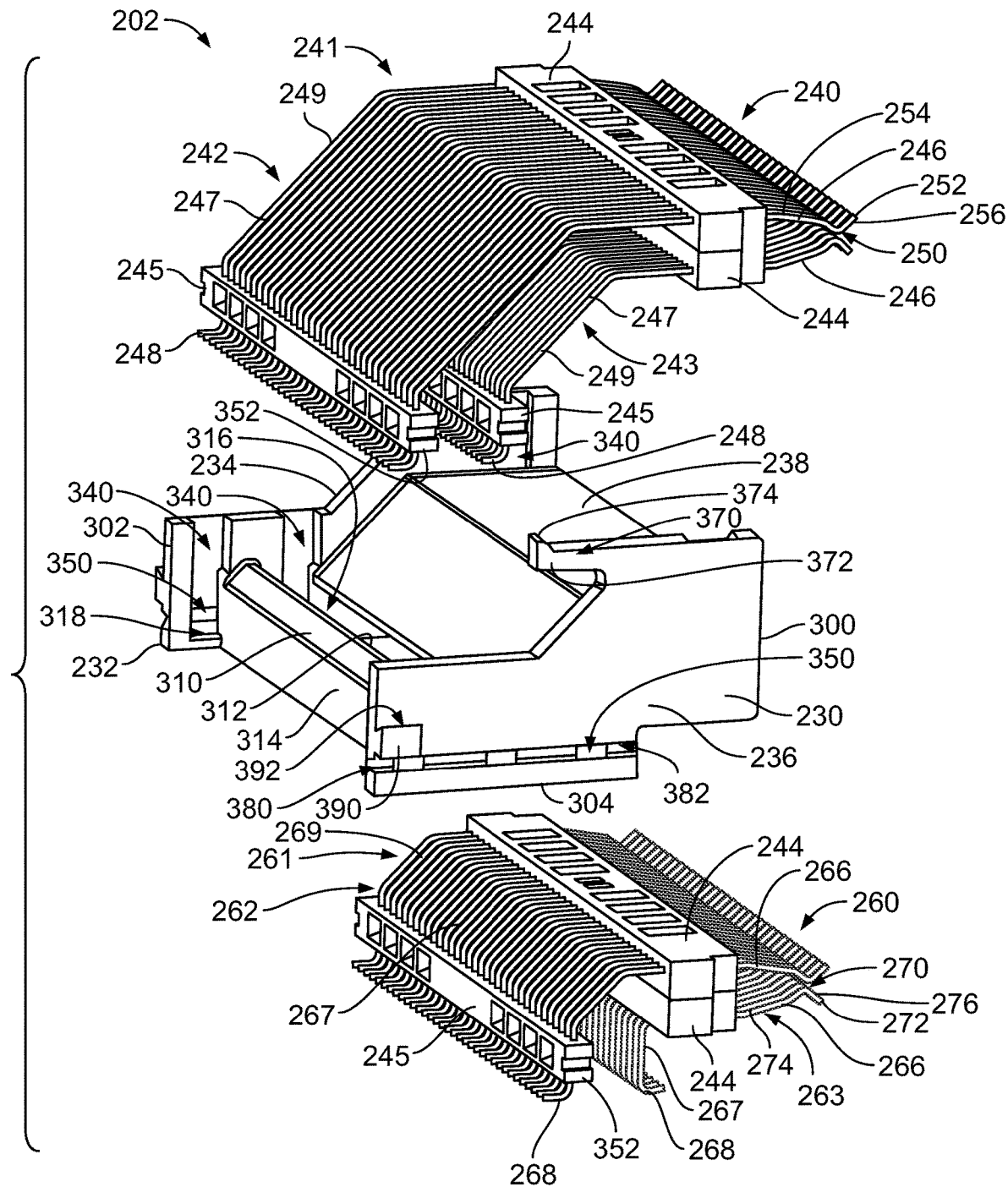
FIG. 10 is an exploded view of a portion of the card edge connector showing a contact assembly in accordance with an exemplary embodiment.

FIG. 10 is an exploded view of a portion of the card edge connector 112 showing the contact assembly 202 in accordance with an exemplary embodiment. In an exemplary embodiment, the contact assembly 202 is a dual card contact assembly configured for interfacing with two circuit cards (for example, the upper and lower module circuit cards 540, 560 (shown in FIG. 1)). The contact assembly 202 includes an upper contact set 241 of upper contacts 240 and a lower contact set 261 of lower contacts 260. The upper contact set 241 is used for mating with the upper module circuit card 540. For example, the upper contacts 240 may be arranged in an upper row and a lower row on opposite sides of the corresponding card slot for mating with the upper surface and the lower surface of the upper module circuit card 540. The lower contact set 261 is used for mating with the lower module circuit card 560. For example, the lower contacts 260 may be arranged in an upper row and a lower row on opposite sides of the corresponding card slot for mating with the upper surface and the lower surface of the lower module circuit card 560. As such, the card edge connector 112 has high density and significant data throughput.

The contact assembly 202 includes a contact positioner 230 supporting the upper contacts 240 and the lower contacts 260. In an exemplary embodiment, the upper contacts 240 are arranged in a first upper contact array 242 and a second upper contact array 243. The upper contact arrays 242, 243 may be leadframes having stamped and formed contacts forming the upper contacts 240. The mating ends of the upper contacts 240 of the first upper contact array 242 are arranged in an upper row for mating with the upper surface of the upper module circuit card 540. The mating ends of the upper contacts 240 of the second upper contact array 243 are arranged in a lower row parallel to and spaced apart from the upper row for mating with the lower surface of the upper module circuit card 540. The upper module circuit card 540 is configured to be received between the mating ends of the upper contacts 240 of the first and second upper contact arrays 241, 243. The mounting ends of the upper contacts 240 of the first upper contact array 242 are arranged in a first row and the mounting ends of the upper contacts 240 of the second upper contact array 243 are arranged in a second row parallel to and spaced apart forward of the first row.

In an exemplary embodiment, the lower contacts 260 are arranged in a first lower contact array 262 and a second lower contact array 263. The lower contact arrays 262, 263 may be leadframes having stamped and formed contacts forming the lower contacts 260. The mating ends of the lower contacts 260 of the first lower contact array 262 are arranged in an upper row for mating with the upper surface of the lower module circuit card 560. The mating ends of the lower contacts 260 of the second lower contact array 263 are arranged in a lower row parallel to and spaced apart from the upper row for mating with the lower surface of the lower module circuit card 560. The lower module circuit card 560 is configured to be received between the mating ends of the lower contacts 260 of the first and second lower contact arrays 261, 263. The mounting ends of the lower contacts 260 of the first lower contact array 262 are arranged in a first row and the mounting ends of the lower contacts 260 of the second lower contact array 263 are arranged in a second row parallel to and spaced apart forward of the first row.

The mating ends of the lower contacts 260 of the first lower contact array 262 are arranged in a first lower row and the mating ends of the lower contacts 260 of the second lower contact array 263 are arranged in a second lower row parallel to and spaced apart from the first lower row. The mounting ends of the lower contacts 260 of the first lower contact array 262 are arranged in a first row and the mounting ends of the lower contacts 260 of the second lower contact array 263 are arranged in a second row parallel to and spaced apart from the first row.

The contact positioner 230 is used to position the upper and lower contacts 240, 260 relative to each other. The contact positioner 230 is used to hold the contact arrays 242, 243, 262, 263 for loading the contact assembly 202 into the outer housing 200. In an exemplary embodiment, the upper and lower contacts 240, 260 are movable relative to the contact positioner 230 for proper alignment and positioning for mating with the upper and lower module circuit cards 540, 560 of the pluggable module 106 and mounting to the host circuit board 102. In various embodiments, the outer housing 200 is used to properly position the contacts 240, 260.

In an exemplary embodiment, the contacts 240, 260 are held by contact holders. For example, the contact arrays 242, 243, 262, 263 include a front contact holder 244 and/or a rear contact holder 245. The front contact holder 244 is positioned proximate to front ends of the contacts 240, 260. The rear contact holder 245 is positioned proximate to rear ends of the contacts 240, 260. In the illustrated embodiment, the second lower contact array 263 does not include a rear contact holder, but rather, only includes the front contact holder 244 due to the lengths of the lower contacts 260 of the second lower contact array 263.

The contact holders 244, 245 encase portions of the contacts 240, 260. In various embodiments, the contact holders 244, 245 are dielectric bodies, such as overmold bodies that are overmolded around portions of the contacts 240, 260, to hold the relative positions of the front and rear ends of the contacts 240, 260, such as for loading the contacts 240, 260 into the contact positioner 230 and/or the outer housing 200. In an exemplary embodiment, the front and rear contact holders 244, 245 are spaced apart from each other. For example, sections of the contacts 240, 260 extend, un-encased, between the contact holders 244, 245. The contacts 240, 260 are independently and freely movable between the contact holders 244, 245. For example, portions of the contacts 240, 260 may be flexed, compressed, shifted, or otherwise moved relative to each other to position the mating ends and the mounting ends within the contact positioner 230.

The contact holders 244, 245 are coupled to the contact positioner 230 to load the upper and lower contacts 240, 260 in the contact positioner 230 to form the contact assembly 202. The assembled contact assembly 202 is configured to be loaded into the outer housing 200, such as through the rear 208 of the outer housing 200.

The contact positioner 230 includes a base 232, first and second side walls 234, 236 extending from the base 232 and a platform 238 between the side walls 234, 236. The platform 238 is located between the upper and lower contact sets 241, 261. The platform 238 separates the upper contacts 240 from the lower contacts 260. The side walls 234, 236 hold the upper and lower contacts 240, 260. For example, the side walls 234, 236 may hold the front contact holders 244 and/or the rear contact holders 245. The base 232 holds the upper and lower contacts 240, 260. For example, the base 232 may hold the rear contact holders 245. The upper and lower contacts 240, 260 are loaded into the base 232 and onto the platform 238 to position the upper and lower contacts 240, 260 for mating with the module circuit card 540 (shown in FIG. 2) and for mounting to the host circuit board 102 (shown in FIG. 1).

Each upper contact 240 includes a transition portion 247 extending between a mating beam 246 at a mating end and a contact tail 248 at a terminating end. The front contact holder 244 supports the mating beams 246 of the upper contacts 240. For example, the front contact holder 244 is provided at the mating beams 246 and/or the transition portions 247. Optionally, portions of the mating beams 246 and/or front portions of the transition portions 247 may be encased in the front contact holder 244. The mating beams 246 extend forward of the front contact holder 244 for mating with the upper module circuit card 540. The mating beams 246 of the first and second upper contact arrays 242, 243 face each other across a gap that receives the upper module circuit card 540. In an exemplary embodiment, the mating beams 246 may be oriented generally horizontally (for example, the mating beams 246 may extend forward from the transition portions 247). The mating beams 246 are configured to extend into the outer housing 200.

The rear contact holder 245 supports the contact tails 248 of the upper contacts 240. For example, the rear contact holder 245 is provided at the contact tails 248 and/or the transition portions 247. Optionally, portions of the contact tails 248 and/or rear portions of the transition portions 247 may be encased in the rear contact holder 245. The contact tails 248 extend from the rear contact holder 245 for termination to the host circuit board 102. For example, the contact tails 248 may be solder tails configured to be soldered to the host circuit board 102. In an exemplary embodiment, the contact tails 248 may be oriented generally vertically (for example, the contact tails 248 may extend downwardly from the transition portions 247). The ends of the contact tails 248 may be bent, such as to form the solder tails. For example, the distal ends of the contact tails 248 may be bent generally horizontally for surface mounting to the host circuit board 102.

In an exemplary embodiment, each upper contact 240 includes an intermediate portion 249 extending between the front contact holder 244 and the rear contact holder 245. The intermediate portion 249 is the un-encased section of the transition portion 247. The intermediate portions 249 may be bent along various sections to transition between the front and rear contact holders 244, 245. For example, the intermediate portions 249 may provide a right angle transition (from horizontal to vertical). The transition may occur at multiple bend sections. For example, the intermediate portions 249 have two 45° bend sections in the illustrated embodiment.

Various upper contacts 240 may be signal contacts (for example, high speed transmit contacts, high speed receive contacts, and low speed sideband contacts) and other upper contacts 240 may be ground contacts, such as interspersed between signal contacts or pairs of signal contacts. In an exemplary embodiment, the upper contacts 240 are flexible and configured to be elastically deformed and flexed, such as during assembly and during mating with the upper module circuit card 540. For example, the intermediate portions 249 may be flexed between the front and rear contact holders 244, 245, such as for relative positioning of the mating beams 246 and the contact tails 248. The mating beams 246 may be cantilevered spring beams extending forward from the front contact holder 244 configured to be flexed when mated with the upper module circuit card 540. The contact tails 248 may be flexed when mounted to the host circuit board 102.

In an exemplary embodiment, the mating beam 246 includes a mating interface 250 at a tip 252 of the upper contact 240. For example, the spring beam defining the mating beam 246 includes an arm 254 and a finger 256 extending from the arm 254 to the tip 252. The arm 254 extends generally forwardly (for example, horizontally) and the finger 256 extends generally inward (for example, vertically) from the arm 254. The finger 256 may be curved and extend both inwardly from the arm 254 to the mating interface 250 and outwardly to the tip 252. The finger 256 may have a flat section between the curved sections to define the mating interface 250. In other various embodiments, the upper contact 240 may end at the mating interface 250 with the tip 252 at the mating interface 250 and does not create an electrical stub beyond the mating interface 250. For example, the upper contact 240 does not include a flared lead-in beyond the mating interface 250 as is common with conventional contacts.

Each lower contact 260 includes a transition portion 267 extending between a mating beam 266 at a mating end and a contact tail 268 at a terminating end. The front contact holder 244 supports the mating beams 266 of the lower contacts 260. For example, the front contact holder 244 is provided at the mating beams 266 and/or the transition portions 267. Optionally, portions of the mating beams 266 and/or front portions of the transition portions 267 may be encased in the front contact holder 244. The mating beams 266 extend forward of the front contact holder 244 for mating with the lower module circuit card 560. The mating beams 266 of the first and second lower contact arrays 262, 263 face each other across a gap that receives the lower module circuit card 560. In an exemplary embodiment, the mating beams 266 may be oriented generally horizontally (for example, the mating beams 266 may extend forward from the transition portions 267). The mating beams 266 are configured to extend into the outer housing 200.

The rear contact holder 245 supports the contact tails 268 of the lower contacts 260 of the first lower contact array 262 (the lower contacts 260 of the second lower contact array 263 may or may not include a rear contact holder 245, such as depending on the lengths of the lower contacts 260). The rear contact holder 245 is provided at the contact tails 268 and/or the transition portions 267. Optionally, portions of the contact tails 268 and/or rear portions of the transition portions 267 may be encased in the rear contact holder 245.

The contact tails 268 of the lower contacts 260 of the first and second lower contact arrays 262, 263 are configured to be terminated to the host circuit board 102. For example, the contact tails 268 may be solder tails configured to be soldered to the host circuit board 102. In an exemplary embodiment, the contact tails 268 may be oriented generally vertically (for example, the contact tails 268 may extend downwardly from the transition portions 267). The ends of the contact tails 268 may be bent, such as to form the solder tails. For example, the distal ends of the contact tails 268 may be bent generally horizontally for surface mounting to the host circuit board 102.

In an exemplary embodiment, each lower contact 260 includes an intermediate portion 269 extending between the front contact holder 244 and the rear contact holder 245. The intermediate portion 269 is the un-encased section of the transition portion 267. The intermediate portions 269 may be bent along various sections to transition between the mating beams 266 and the contact tails 268. For example, the intermediate portions 269 may provide a right angle transition (from horizontal to vertical). The transition may occur at multiple bend sections.

Various lower contacts 260 may be signal contacts (for example, high speed transmit contacts, high speed receive contacts, and low speed sideband contacts) and other lower contacts 260 may be ground contacts, such as interspersed between signal contacts or pairs of signal contacts. In an exemplary embodiment, the lower contacts 260 are flexible and configured to be elastically deformed and flexed, such as during assembly and during mating with the lower module circuit card 560. For example, the intermediate portions 269 may be flexed between the front and rear contact holders 244, 245, such as for relative positioning of the mating beams 266 and the contact tails 268. The mating beams 266 may be cantilevered spring beams extending forward from the front contact holder 244 configured to be flexed when mated with the lower module circuit card 560. The contact tails 268 may be flexed when mounted to the host circuit board 102.

In an exemplary embodiment, the mating beam 266 includes a mating interface 270 at a tip 272 of the lower contact 260. For example, the spring beam defining the mating beam 266 includes an arm 274 and a finger 276 extending from the arm 274 to the tip 272. The arm 274 extends generally forwardly (for example, horizontally) and the finger 276 extends generally inward (for example, vertically) from the arm 274. The finger 276 may be curved and extend both inwardly from the arm 274 to the mating interface 270 and outwardly to the tip 272. The finger 276 may have a flat section between the curved sections to define the mating interface 270. In other various embodiments, the lower contact 260 may end at the mating interface 270 with the tip 272 at the mating interface 270 and does not create an electrical stub beyond the mating interface 270. For example, the lower contact 260 does not include a flared lead-in beyond the mating interface 270 as is common with conventional contacts.

In an exemplary embodiment, the contact positioner 230 is a right-angle contact positioner having a mating end at a front 300 of the contact positioner 230 and a mounting end at a bottom 304 of the contact positioner 230. The base 232 is provided at the bottom 304. The platform 238 extends to the front 300. Other orientations are possible in alternative embodiments.

The base 232 includes a divider wall 310 extending between the side walls 234, 236. The divider wall 310 includes a front surface 312 and a rear surface 314. The divider wall 310 separates a front pocket 316 from a rear pocket 318. The front pocket 316 is configured to receive the upper contacts 240 of the second upper contact array 243. The rear pocket 318 is configured to receive the upper contacts 240 of the first upper contact array 242.

In an exemplary embodiment, the side walls 234, 236 extend forward from the base 232 to support the platform 238. The side walls 234, 236 and/or the base 232 include slots 340 that receive the contact holders 244, 245. The slots 340 may be open at the top to receive the contact holders 244, 245 of the upper contact arrays 242, 243 and the slots 340 may be open at the bottom to receive the contact holders 244, 245 of the lower contact arrays 262, 263. In an exemplary embodiment, the contact positioner 230 includes the slots 340 aligned with the front and rear pockets 316, 318.

In an exemplary embodiment, the contact positioner 230 includes securing features 350 configured to interface with the rear contact holders 245. In an exemplary embodiment, the securing features 350 include pockets or windows configured to receive portions of the rear contact holders 245. The securing features 350 may be provided along the slots 340. In an exemplary embodiment, the rear contact holders 245 include securing features 352 that interface with the securing features 350 to secure the rear contact holders 245 to the contact positioner 230. The securing features 352 may be tabs or protrusions configured to be received in the windows. For example, the securing features 352 may be latchably secured to the securing features 350.

The contact positioner 230 includes latching features 370 for securing the contact positioner 230 in the outer housing 200. In an exemplary embodiment, the latching feature 370 includes a deflectable latch 372 having a latching tip 374. The latch 372 is configured to be latchably coupled to the outer housing 200. Other types of securing features may be used in alternative embodiments. The latching features 370 are provided on the side walls 234, 236 in the illustrated embodiment.

The contact positioner 230 includes guide features 380 to guide mating of the contact positioner 230 with the outer housing 200. In the illustrated embodiment, the guide features 380 include guide slots 382 extending along the base 232 and/or the side walls 234, 236. The guide slots 382 are open at the front 300. The guide slots 382 may be open at a rear 302. Other types of guide features 380 may be provided in alternative embodiments.

The contact positioner 230 includes locating features 390 to locate the contact positioner 230 relative to the outer housing 200. In the illustrated embodiment, the locating features 390 include dovetails 392 extending along the base 232 and/or the side walls 234, 236. The dovetails 392 are provided at the rear 302. The dovetails 392 are configured to be coupled to the outer housing 200.

Figure 11:
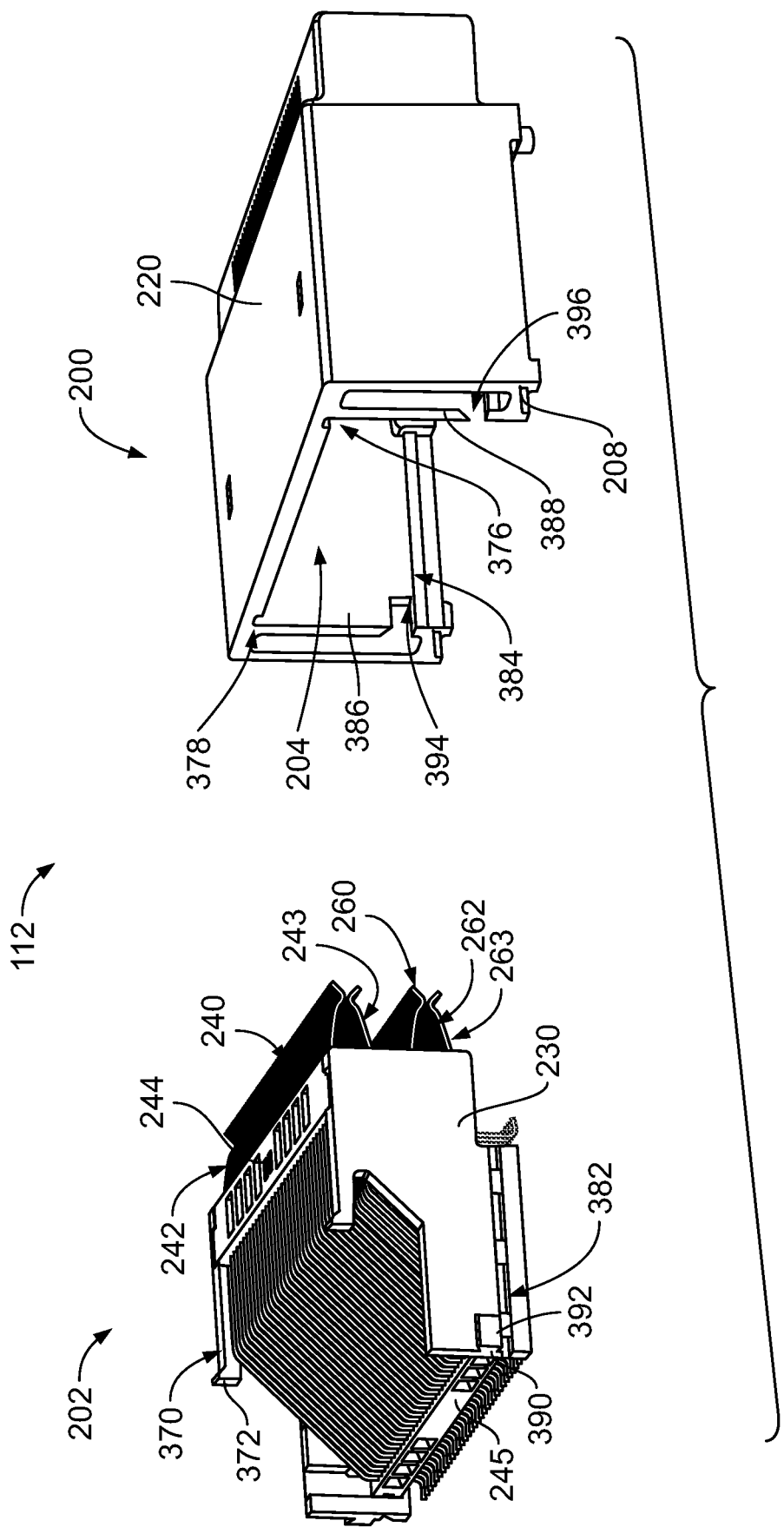
FIG. 11 is an exploded view of the card edge connector in accordance with an exemplary embodiment showing the contact assembly poised for loading into the outer housing.

FIG. 11 is an exploded view of the card edge connector 112 in accordance with an exemplary embodiment showing the contact assembly 202 poised for loading into the outer housing 200. When assembled, the contact arrays 242, 243, 262, 263 are coupled to the contact positioner 230. The front and rear contact holders 244, 245 are coupled to the contact positioner 230 to position the upper contacts 240 and the lower contacts 260 for loading into the outer housing 200 and mounting to the host circuit board 102 (FIG. 1).

The contact assembly 202 is aligned with the rear 208 of the outer housing 200. The contact assembly 202 is loaded into the cavity 204 through the rear 208. In an exemplary embodiment, the outer housing 200 includes latching features 376 (FIG. 9) interfacing with the latching features 370 of the contact positioner 230. For example, the latching features 376 include latch slots 378 that receive the latches 372. The latch slots 378 may be provided in the top wall 220. The latches 372 are secured in the latch slots 378 to secure the contact assembly 202 in the outer housing 200.

In an exemplary embodiment, the outer housing 200 includes guide rails 384 at first and second side walls 386, 388 of the outer housing 200. The guide rails 384 are received in the guide slots 382 to guide mating of the contact assembly 202 with the outer housing 200. Other types of guide features may be used in alternative embodiments.

In an exemplary embodiment, the outer housing 200 includes locating features 394 at the first and second side walls 386, 388. The locating features 394 interface with the locating features 390 to locate the contact assembly 202 relative to the outer housing 200. In the illustrated embodiment, the locating features 390 include dovetail slots 396. The dovetail slots 396 receive the dovetails 392. The dovetail slots 396 include angled walls defining the dovetail slots 396. The dovetail slots 396 may be used to limit movement of the contact positioner 230 relative to the outer housing 200. The contact positioner 230 includes locating features 390 to locate the contact positioner 230 relative to the outer housing 200. The dovetail slots 396 are provided at the rear 208.

Figure 12:
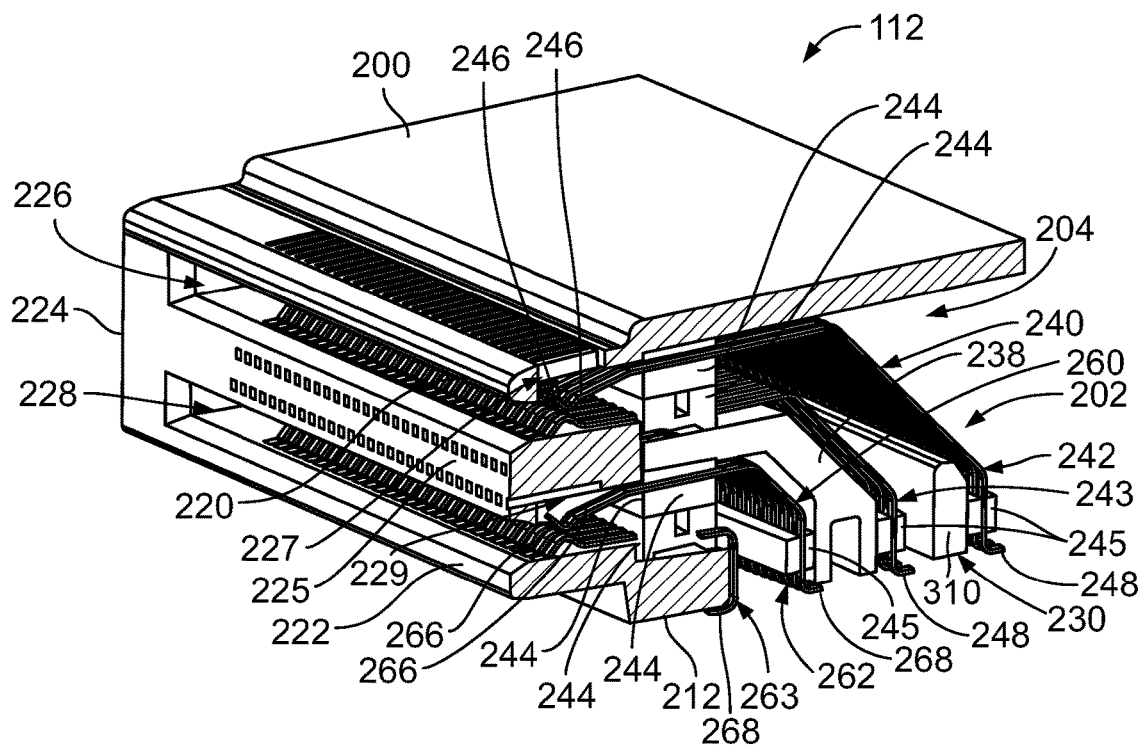
FIG. 12 is a sectional view of the card edge connector in accordance with an exemplary embodiment.
Figure 13:
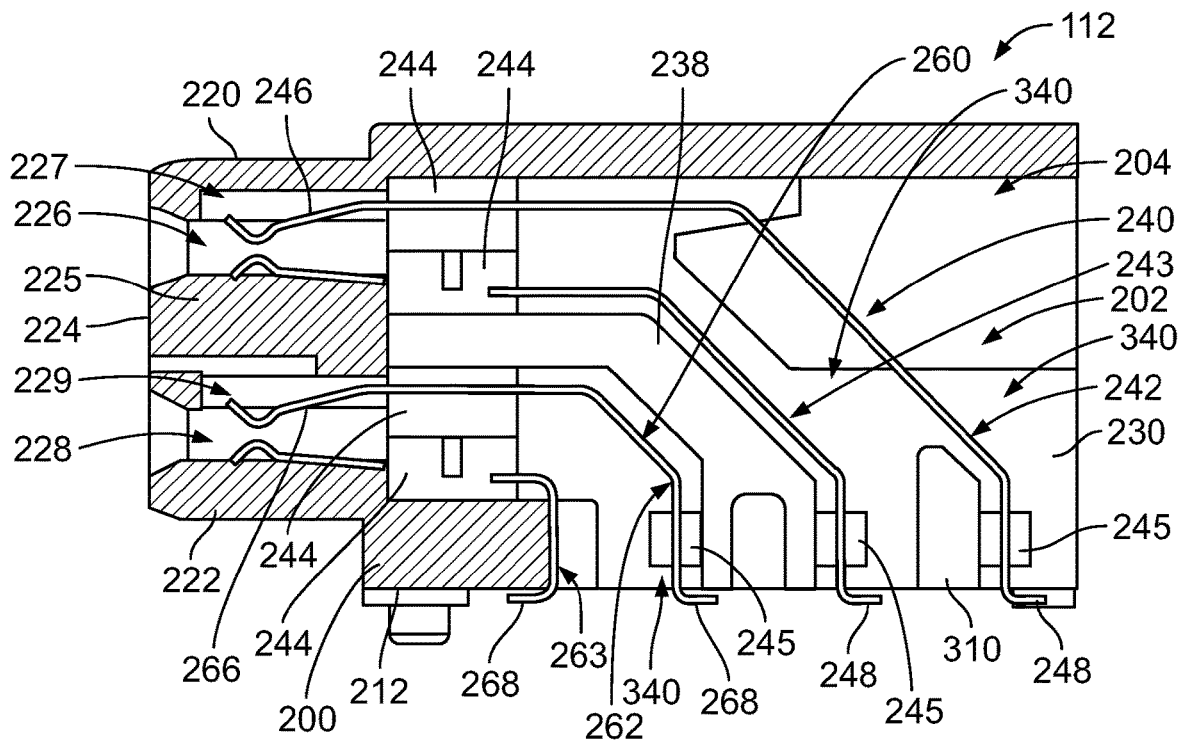
FIG. 13 is a cross-sectional view of the card edge connector in accordance with an exemplary embodiment.

FIG. 12 is a sectional view of the card edge connector 112 in accordance with an exemplary embodiment. FIG. 13 is a cross-sectional view of the card edge connector 112 in accordance with an exemplary embodiment. The contact assembly 202 is received in the cavity 204 of the outer housing 200. The mating beams 246 of the upper contacts 240 are received in the upper card slot 226 for mating with the upper module circuit card 540. The mating beams 266 of the lower contacts 260 are received in the lower card slot 228.

In an exemplary embodiment, the outer housing 200 includes a divider wall 225 between the upper card slot 226 and the lower card slot 228. The divider wall 225 is located between the top wall 220 and the bottom wall 222 along the shroud 224. The outer housing 200 includes upper contact channels 227 in the top wall 220 and the divider wall 225 that receive the mating beams 246 of the upper contacts 240. The outer housing 200 includes lower contact channels 229 in the bottom wall 222 and the divider wall 225 that receive the mating beams 266 of the lower contacts 260.

In an exemplary embodiment, the divider wall 225 is aligned with the platform 238. The platform 238 and the divider wall 225 separate the upper contacts 240 from the lower contacts 260. The front and the rear contact holders 244, 245 position the contacts 240, 260 relative to the contact positioner 230. For example, the upper front contact holders 244 position the upper mating beams 246 between the top wall 220 of the outer housing 200 and the divider wall 225 and the platform 238. Similarly, the lower front contact holders 244 position the lower mating beams 266 between the bottom wall 222 of the outer housing 200 and the divider wall 225 and the platform 238. The front contact holders 244 may hold the contacts 240, 260 spaced apart from the contact positioner 230 and the outer housing 200. The rear contact holders 245 position the contact tails 248, 268 relative to the contact positioner 230 for mounting to the host circuit board 102. The rear contact holders 245 are held in corresponding slots 340 to position the contact tails 248, 268. The divider wall 310 is located between the contact tails 248 of the first upper contact array 242 and the contact tails 248 of the second upper contact array 243. The platform 238 is located between the contact tails 248 of the second upper contact array 243 and the contact tails 268 of the first lower contact array 262. The contact tails 268 of the second lower contact array 263 are not supported by a rear contact holder, but rather extend from the front contact holder 244 along the outer housing 200 to the bottom 212. The lower contacts 260 of the second lower contact array 263 are short enough that the contact tails 268 are supported by the front contact holder 244. Relative positions of the contact tails 268 may be sufficiently controlled and maintained due to the relatively short length from the front contact holder 244 to the contact tails 268.

The card edge connector 112 has a footprint at the bottom for mounting to the host circuit board 102 (FIG. 1). The footprint is defined by the contact tails 248, 268. The contact tails 248, 268 are positioned by the contact positioner 230 for mounting to the host circuit board 102. In an exemplary embodiment, the bottom edges of the contact tails 248, 268 are coplanar for surface mounting to the host circuit board 102. The bottom edges of the contact tails 248, 268 may be held coplanar for soldering to the host circuit board 102. In an exemplary embodiment, the upper contact tails 248 of the first upper contact array 242 are rearward facing and the upper contact tails 248 of the second upper contact array 243 are rearward facing. In an exemplary embodiment, the lower contact tails 268 of the first lower contact array 262 are rearward facing and the lower contact tails 268 of the second lower contact array 263 are forward facing. By forward facing the lower contact tails 268 of the second lower contact array 263, the trace routing patterns of the host circuit board 102 may be optimized, such as by routing the traces in different directions, leading to higher density and/or fewer layers in the host circuit board 102.

With additional reference back to FIGS. 8 and 9, the upper and lower contacts 240, 260 are arranged within the card edge connector 112 to enhance signal integrity. For example, the arrangement of the upper and lower contacts 240, 260 are arranged to reduce cross-talk. In an exemplary embodiment, the upper contacts 240 include upper high speed transmit contacts 280, upper high speed receive contacts 282, upper low speed sideband contacts 284, and upper ground contacts 286. In an exemplary embodiment, the upper high speed transmit contacts 280 are grouped together and the upper high speed receive contacts 282 are grouped together. The upper high speed transmit contacts 280 are arranged in pairs and the pairs are separated by corresponding upper ground contacts 286. The upper high speed receive contacts 282 are arranged in pairs and the pairs are separated by corresponding upper ground contacts 286. In an exemplary embodiment, the upper high speed transmit contacts 280 are separated from the upper high speed receive contacts 282 by the upper low speed sideband contacts 284. By separating the upper high speed transmit contacts 280 from the upper high speed receive contacts 282, cross-talk is reduced and signal integrity is enhanced. Optionally, subsets of the upper low speed sideband contacts 284 may be provided at the outer sides of the upper high speed transmit contacts 280 and the upper high speed receive contacts 282. For example, the upper high speed transmit contacts 280 and the upper high speed receive contacts 282 may be flanked by the upper low speed sideband contacts 284.

The lower contacts 260 include lower high speed transmit contacts 290, lower high speed receive contacts 292, lower low speed sideband contacts 294, and lower ground contacts 296. In an exemplary embodiment, the lower high speed transmit contacts 290 are grouped together and the lower high speed receive contacts 292 are grouped together. The lower high speed transmit contacts 290 are arranged in pairs and the pairs are separated by corresponding lower ground contacts 296. The lower high speed receive contacts 292 are arranged in pairs and the pairs are separated by corresponding lower ground contacts 296. In an exemplary embodiment, the lower high speed transmit contacts 290 are separated from the lower high speed receive contacts 292 by the lower low speed sideband contacts 294. By separating the lower high speed transmit contacts 290 from the lower high speed receive contacts 292, cross-talk is reduced and signal integrity is enhanced. Optionally, subsets of the lower low speed sideband contacts 294 may be provided at the outer sides of the lower high speed transmit contacts 290 and the lower high speed receive contacts 292. For example, the lower high speed transmit contacts 290 and the lower high speed receive contacts 292 may be flanked by the lower low speed sideband contacts 294.

In an exemplary embodiment, the upper high speed transmit contacts 280 are offset from the lower high speed transmit contacts 290 and the upper high speed receive contacts 282 are offset from the lower high speed receive contacts 292. For example, the upper high speed transmit contacts 280 are provided at a first side 235 of the contact positioner 230 and the upper high speed receive contacts 282 are provided at a second side 237 of the contact positioner 230. One or more of the upper low speed sideband contacts 284 are located between the upper high speed transmit contacts 280 and the upper high speed receive contacts 290, such as approximately centered in the upper contact set 241. The lower high speed transmit contacts 290 are provided at the second side 237 of the contact positioner 230 and the lower high speed receive contacts 292 are provided at the first side 235 of the contact positioner 230. One or more of the lower low speed sideband contacts 294 are located between the lower high speed transmit contacts 290 and the lower high speed receive contacts 292. The upper high speed transmit contacts 280 are aligned with the lower high speed receive contacts 292 and the upper high speed receive contacts 282 are aligned with the lower high speed transmit contacts 290. By offsetting the upper high speed transmit contacts 280 from the lower high speed transmit contacts 290 and offsetting the upper high speed receive contacts 282 from the lower high speed receive contacts 292 cross-talk is reduced and signal integrity is enhanced.

Figure 14:
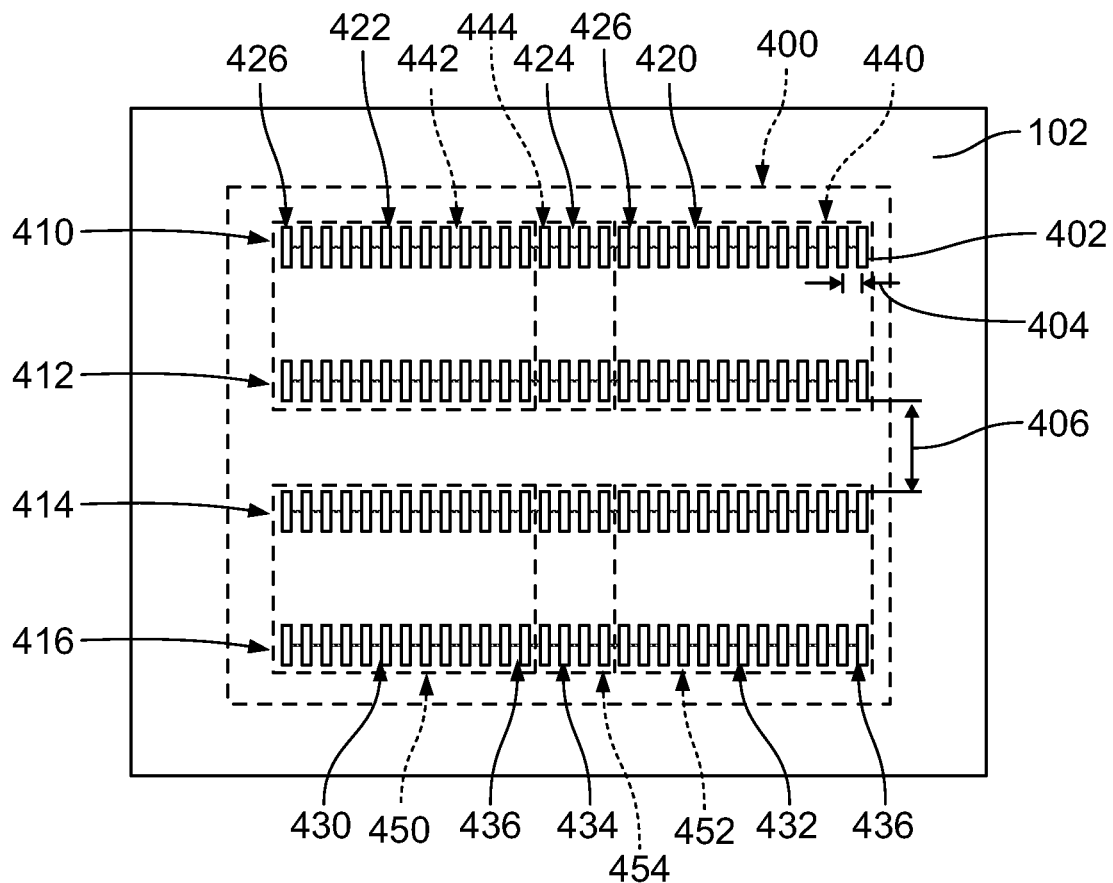
FIG. 14 illustrates a footprint of a host circuit board in accordance with an exemplary embodiment.

FIG. 14 illustrates a footprint 400 of the host circuit board 102 in accordance with an exemplary embodiment. The host circuit board 102 includes contact pads 402 within the footprint 400. In an exemplary embodiment, the contact pads 402 are arranged in four rows 410, 412, 414, 416 corresponding to the four rows of contact tails 248, 268 (shown in FIG. 9) of the card edge connector 112. The contact tails 248, 268 are configured to be surface mounted to the contact pads 402, such as being soldered to the contact pads 402. The contact pads 402 may have a uniform pitch 404 between the contact pads 402 and a uniform spacing 406 between the rows 410, 412, 414, 416. The contact pads 402 are connected to traces and/or vias of the host circuit board 102 for routing the signals to/from the contact pads 402.

The contact pads 402 are arranged within the footprint 400 for electrical connection with corresponding upper and lower contacts 240, 260 of the card edge connector 112. The contact pads 402 may be arranged to enhance signal integrity, such as to reduce cross-talk. In an exemplary embodiment, the contact pads 402 include upper high speed transmit contact pads 420, upper high speed receive contact pads 422, upper low speed sideband contact pads 424, and upper ground contact pads 426 and the contact pads 402 include lower high speed transmit contact pads 430, lower high speed receive contact pads 432, lower low speed sideband contact pads 434, and lower ground contact pads 436.

In an exemplary embodiment, the upper high speed transmit contact pads 420 are grouped together in a first area 440 and the upper high speed receive contact pads 422 are grouped together in a first area 442. The upper high speed transmit contact pads 420 are arranged in pairs and the pairs are separated by corresponding upper ground contact pads 426. The upper high speed receive contact pads 422 are arranged in pairs and the pairs are separated by corresponding upper ground contact pads 426. The upper low speed sideband contact pads 424 may be grouped together in a third area 444. In an exemplary embodiment, the upper high speed transmit contact pads 420 are separated from the upper high speed receive contact pads 422 by the upper low speed sideband contact pads 424. By separating the upper high speed transmit contact pads 420 from the upper high speed receive contact pads 422, cross-talk is reduced and signal integrity is enhanced. Optionally, subsets of the upper low speed sideband contact pads 424 may be provided at the outer sides of the upper high speed transmit contact pads 420 and the upper high speed receive contact pads 422.

In an exemplary embodiment, the lower high speed transmit contact pads 430 are grouped together in a fourth area 450 and the lower high speed receive contact pads 432 are grouped together in a fifth area 452. The lower high speed transmit contact pads 430 are arranged in pairs and the pairs are separated by corresponding lower ground contact pads 436. The lower high speed receive contact pads 432 are arranged in pairs and the pairs are separated by corresponding lower ground contact pads 436. The lower low speed sideband contact pads 434 may be grouped together in a sixth area 454. In an exemplary embodiment, the lower high speed transmit contact pads 430 are separated from the lower high speed receive contact pads 432 by the lower low speed sideband contact pads 434. By separating the lower high speed transmit contact pads 430 from the lower high speed receive contact pads 432, cross-talk is reduced and signal integrity is enhanced. Optionally, subsets of the lower low speed sideband contact pads 434 may be provided at the outer sides of the lower high speed transmit contact pads 430 and the lower high speed receive contact pads 432.

In an exemplary embodiment, the upper high speed transmit contact pads 420 are offset from the lower high speed transmit contact pads 430 and the upper high speed receive contact pads 422 are offset from the lower high speed receive contact pads 432. One or more of the lower low speed sideband contact pads 434 are located between the lower high speed transmit contact pads 430 and the lower high speed receive contact pads 432. The upper high speed transmit contact pads 420 are aligned with the lower high speed receive contact pads 432 and the upper high speed receive contact pads 422 are aligned with the lower high speed transmit contact pads 430. By offsetting the upper high speed transmit contact pads 420 from the lower high speed transmit contact pads 430 and offsetting the upper high speed receive contact pads 422 from the lower high speed receive contact pads 432 cross-talk is reduced and signal integrity is enhanced.

Figure 15:
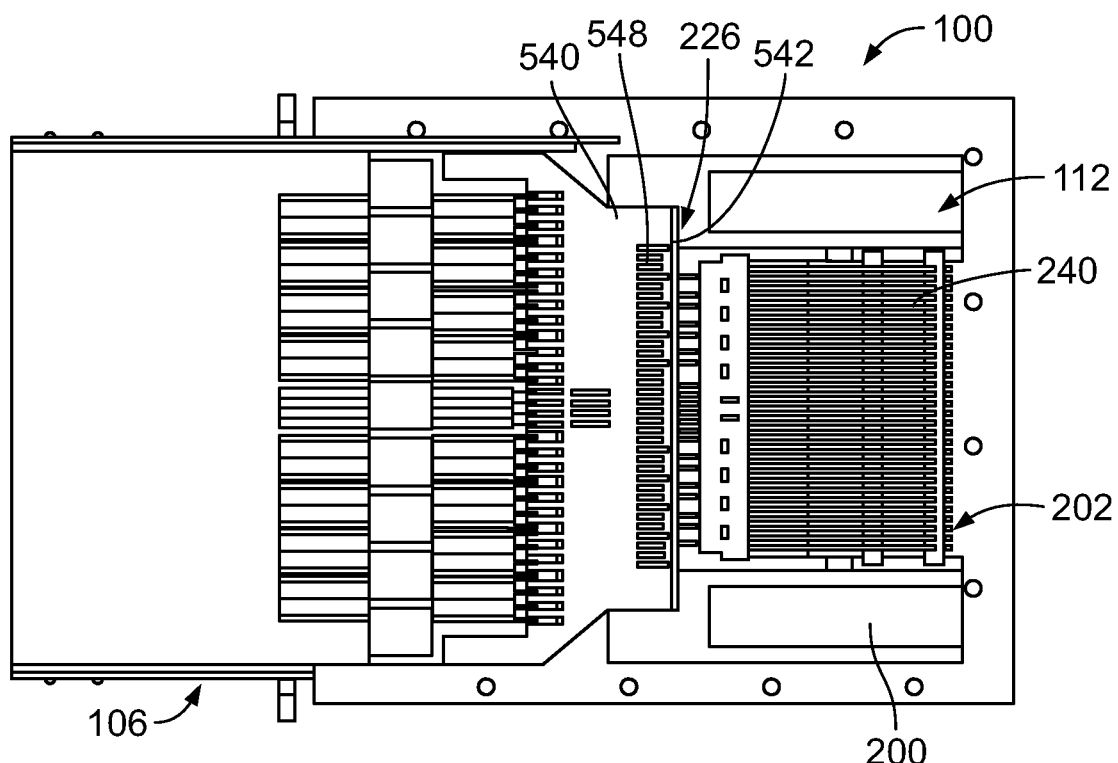
FIG. 15 is a partial sectional view of the communication system showing the pluggable module coupled to the card edge connector in accordance with an exemplary embodiment.

FIG. 15 is a partial sectional view of the communication system 100 showing the pluggable module 106 coupled to the card edge connector 112. The receptacle cage 110 (shown in FIG. 1) is removed for clarity. The card edge 542 of the upper module circuit card 540 is received in the upper card slot 226 of the outer housing 200 for interfacing with the upper contacts 240. The contact pads 548 of the upper module circuit card 540 have a pinout that corresponds to the arrangement of the high speed, low speed, and ground contacts of the card edge connector 112.

Figure 16:
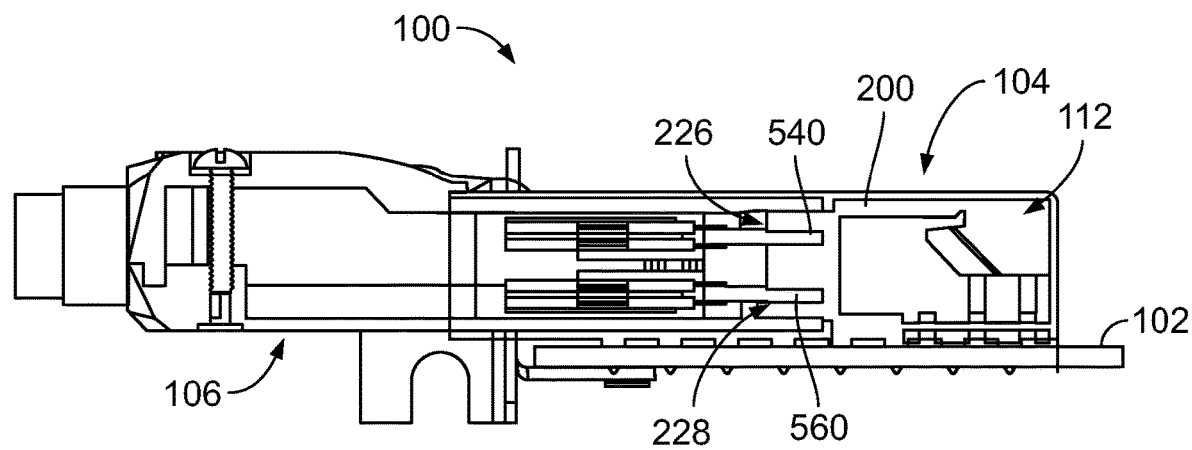
FIG. 16 is a cross-sectional view of the communication system showing the pluggable module plugged into the receptacle connector assembly in accordance with an exemplary embodiment.
Figure 17:
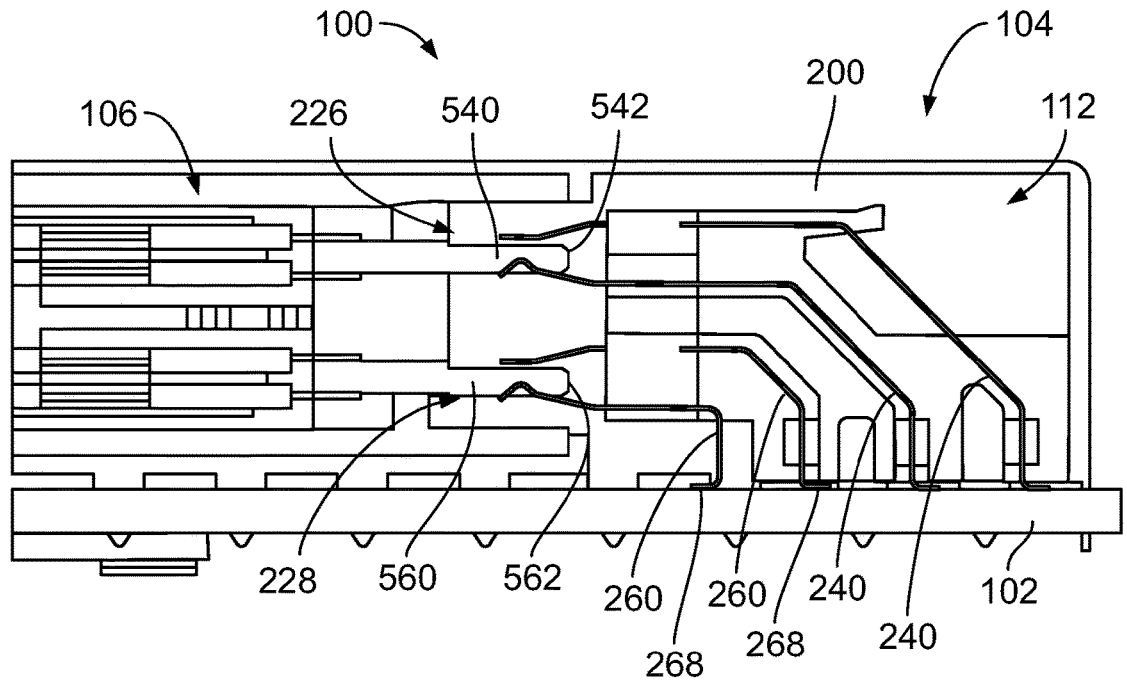
FIG. 17 is an enlarged cross-sectional view of a portion of the communication system showing the pluggable module plugged into the receptacle connector assembly in accordance with an exemplary embodiment.

FIG. 16 is a cross-sectional view of the communication system 100 showing the pluggable module 106 plugged into the receptacle connector assembly 104. FIG. 17 is an enlarged cross-sectional view of a portion of the communication system 100 showing the pluggable module 106 plugged into the receptacle connector assembly 104. The card edges 542, 562 of the module circuit cards 540, 560 are received in the card slot 226, 228 of the outer housing 200 for interfacing with the upper contacts 240 and the lower contacts 260, respectively. The contact tails 248, 268 are terminated to the host circuit board 102. The card edge connector 112 electrically connects the upper and lower module circuit cards 540, 560 to the host circuit board 102.

Figure 18:
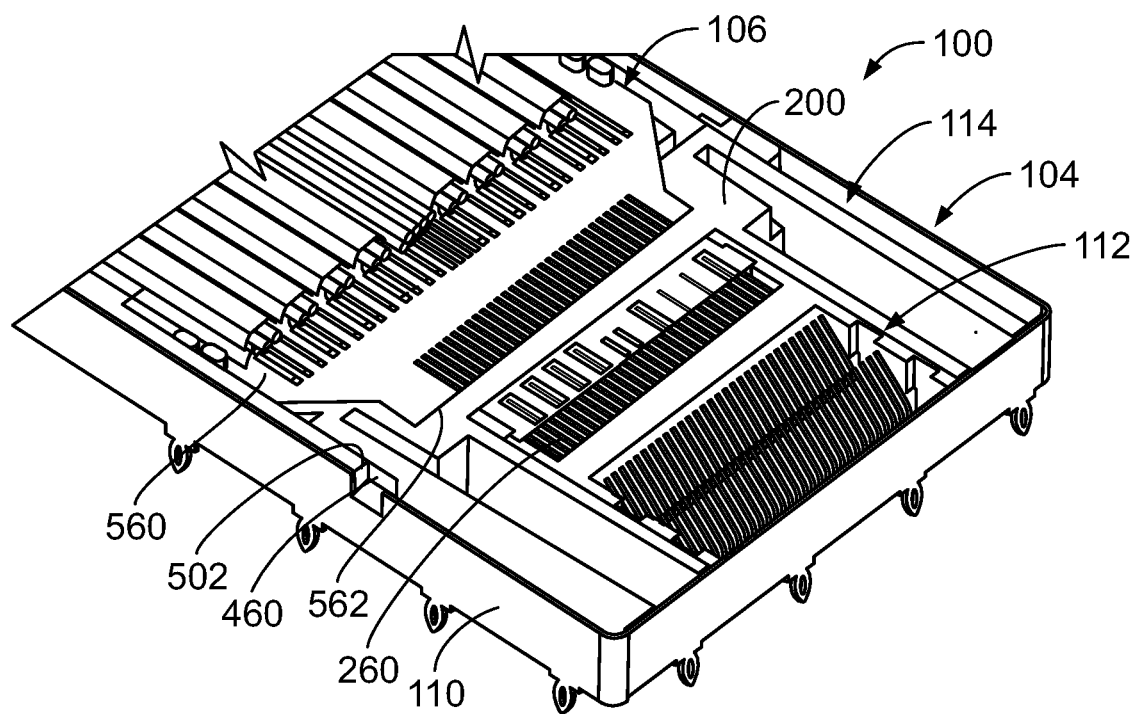
FIG. 18 is a partial sectional view of the communication system showing the pluggable module plugged into the receptacle connector assembly in accordance with an exemplary embodiment.
Figure 19:
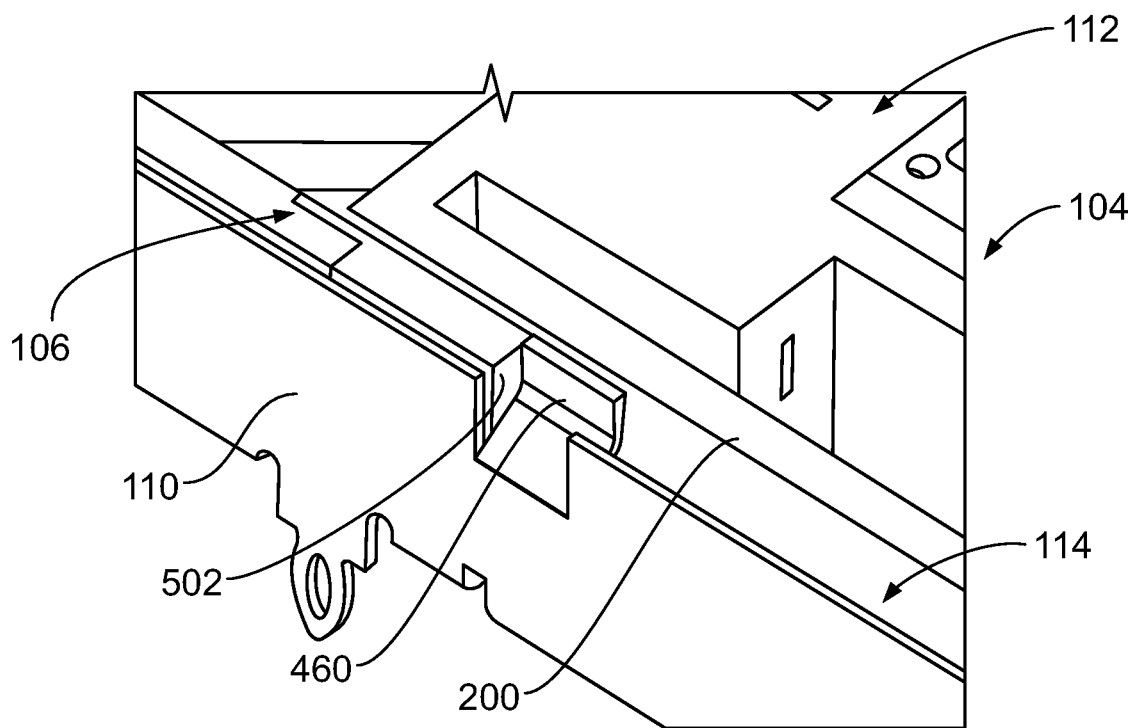
FIG. 19 is an enlarged, partial sectional view of the communication system showing the pluggable module plugged into the receptacle connector assembly in accordance with an exemplary embodiment.

FIG. 18 is a partial sectional view of the communication system 100 showing the pluggable module 106 plugged into the receptacle connector assembly 104. FIG. 19 is an enlarged, partial sectional view of the communication system 100 showing the pluggable module 106 plugged into the receptacle connector assembly 104. The card edge 562 of the lower module circuit card 560 is received in the lower card slot 228 of the outer housing 200 for interfacing with the lower contacts 260.

In an exemplary embodiment, the receptacle cage 110 includes a plug stop 460 extending into the cavity 114. The plug stop 460 is used to position the pluggable module 106 in the receptacle cage 110. For example, the plug stop 460 may be stamped and formed to extend into the cavity 114. The plug stop 460 limits loading of the pluggable module 106 into the receptacle cage 110 for mating with the card edge connector 112. For example, the mating end 502 of the pluggable body 106 engages the plug stop 460 to stop loading of the pluggable module 106 into the receptacle cage 110.

Figure 20:
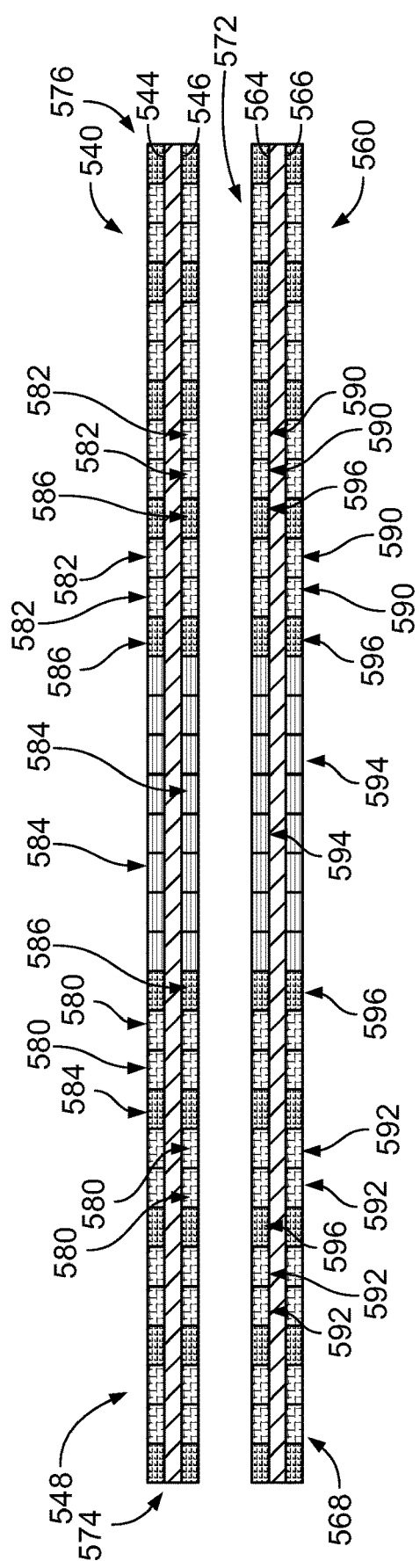
FIG. 20 is a schematic view of a mating interface of the pluggable module showing a pinout of contact pads of upper and lower module circuit cards in accordance with an exemplary embodiment.
Figure 20:
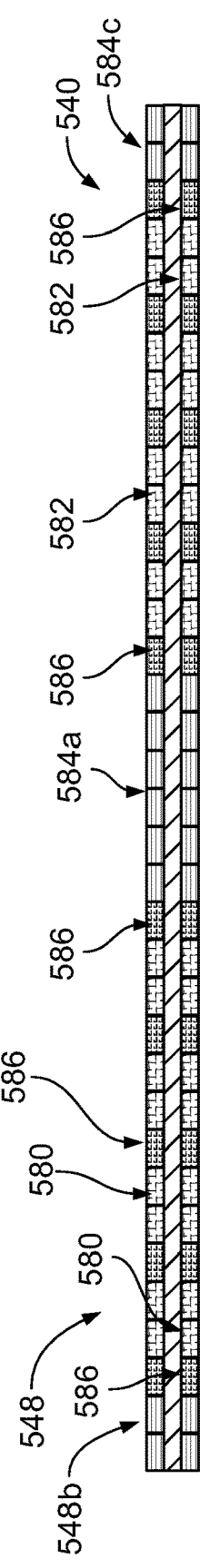

FIG. 20 is a schematic view of the mating interface of the pluggable module 106 showing a pinout of the upper and lower contact pads 548, 568 of the upper and lower module circuit cards 540, 560 in accordance with an exemplary embodiment. The upper and lower module circuit cards 540, 560 are separated by a card gap 572. The upper and lower module circuit cards 540, 560 extend between a first side 574 and a second side 576 of the pluggable module 106. The upper contact pads 548 are provided at the upper surface 544 and the lower surface 546. The lower contact pads 568 are provided at the upper surface 564 and the lower surface 566.

In an exemplary embodiment, the upper contact pads 548 include upper high speed transmit contact pads 580, upper high speed receive contact pads 582, upper low speed sideband contact pads 584, and upper ground contact pads 586. In an exemplary embodiment, the lower contact pads 568 include lower high speed transmit contact pads 590, lower high speed receive contact pads 592, lower low speed sideband contact pads 594, and lower ground contact pads 596.

In an exemplary embodiment, the upper and lower contact pads 548, 568 are arranged to enhance signal integrity, such as to reduce cross-talk. The upper high speed transmit contact pads 580 are arranged in pairs with the upper ground contact pads 586 arranged between the pairs. The upper high speed receive contact pads 582 are arranged in pairs with the upper ground contact pads 586 arranged between the pairs. The lower high speed transmit contact pads 590 are arranged in pairs with the lower ground contact pads 596 arranged between the pairs. The lower high speed receive contact pads 592 are arranged in pairs with the lower ground contact pads 596 arranged between the pairs.

In an exemplary embodiment, the upper high speed transmit contact pads 580 are provided proximate to the first side 574 and the upper high speed receive contact pads 582 are provided proximate to the second side 576. In an exemplary embodiment, the upper low speed sideband contact pads 584 are located between the upper high speed transmit contact pads 580 and the upper high speed receive contact pads 582. Optionally, all of the upper low speed sideband contact pads 584 may be located between the upper high speed transmit contact pads 580 and the upper high speed receive contact pads 582. The lower high speed transmit contact pads 590 are provided proximate to the second side 576 and the lower high speed receive contact pads 592 are provided proximate to the first side 574. In an exemplary embodiment, the lower low speed sideband contact pads 594 are located between the lower high speed transmit contact pads 590 and the lower high speed receive contact pads 592. Optionally, all of the lower low speed sideband contact pads 594 may be located between the lower high speed transmit contact pads 590 and the lower high speed receive contact pads 592.

In an exemplary embodiment, the upper high speed transmit contact pads 580 are aligned with the lower high speed receive contact pads 592 and the upper high speed receive contact pads 582 are aligned with the lower high speed transmit contact pads 590. The upper module circuit card 540 is spaced apart from the lower module circuit card 560 by the card gap 572. The upper high speed transmit contact pads 580 on the lower surface 546 of the upper module circuit card 540 face the lower high speed receive contact pads 592 on the upper surface 564 of the lower module circuit card 560 across the card gap 572. The upper high speed receive contact pads 582 on the lower surface 546 of the upper module circuit card 540 face the lower high speed transmit contact pads 590 on the upper surface 564 of the lower module circuit card 560 across the card gap 572.

Figure 21:
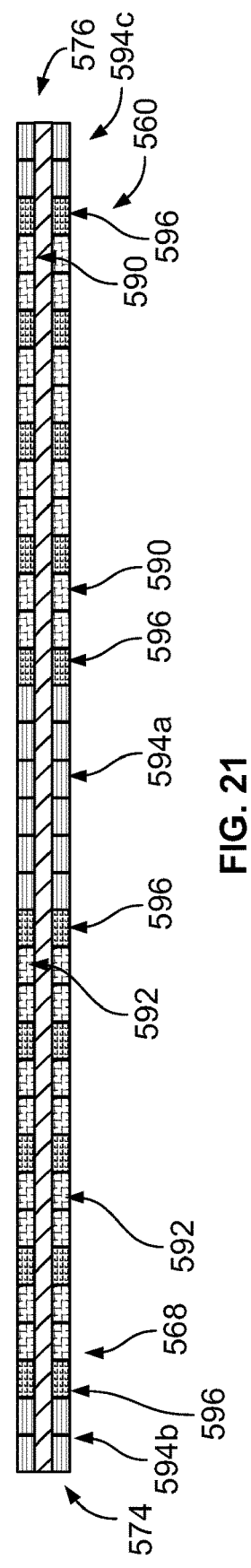
FIG. 21 is a schematic view of a mating interface of the pluggable module showing a pinout of contact pads of upper and lower module circuit cards in accordance with an exemplary embodiment.

FIG. 21 is a schematic view of the mating interface of the pluggable module 106 showing a pinout of the upper and lower contact pads 548, 568 of the upper and lower module circuit cards 540, 560 in accordance with an exemplary embodiment. The low speed, sideband contacts are in a different arrangement than in the embodiment shown in FIG. 20.

The upper low speed sideband contact pads 584 include interior upper low speed sideband contact pads 584a, first exterior upper low speed sideband contact pads 584b, and second exterior upper low speed sideband contact pads 584c. The interior upper low speed sideband contact pads 584a are located between the upper high speed transmit contact pads 580 and the upper high speed receive contact pads 582. The first exterior upper low speed sideband contact pads 584b are located at the first side 574 exterior of the upper high speed transmit contact pads 580. The second exterior upper low speed sideband contact pads 584c are located at the second side 576 exterior of the upper high speed receive contact pads 582.

The lower low speed sideband contact pads 594 include interior lower low speed sideband contact pads 594a, first exterior lower low speed sideband contact pads 594b, and second exterior lower low speed sideband contact pads 594c. The interior lower low speed sideband contact pads 594a are located between the lower high speed transmit contact pads 590 and the lower high speed receive contact pads 592. The first exterior lower low speed sideband contact pads 594b are located at the first side 574 exterior of the lower high speed receive contact pads 592. The second exterior lower low speed sideband contact pads 594c are located at the second side 576 exterior of the lower high speed transmit contact pads 590.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 30 U.S.C. § 112(f), unless and until such claim limitations expressly use the phrase "means for" followed by a statement of function void of further structure.

What is claimed is:

1. A card edge connector for mating with a pluggable module comprising:
    a housing including a top and a bottom, the housing having a front and a rear, the housing having a first side and a second side, the bottom configured to be mounted to a host circuit board, the housing including a cavity, the housing including an upper card slot open to the cavity at the front of the housing and a lower card slot open to the cavity at the front of the housing, the upper card slot configured to receive a card edge of an upper module circuit card of the pluggable module, the lower card slot configured to receive a card edge of a lower module circuit card of the same pluggable module; and
    a contact assembly received in the cavity, the contact assembly having a contact positioner holding an upper contact set of upper contacts and a lower contact set of lower contacts, the contact positioner including a guide feature to guide mating of the contact assembly in the cavity of the housing, the contact positioner including a latching feature configured to be latchably secured to the housing to secure the contact assembly in the cavity of the housing;
    the upper contact set having a first upper contact array of the upper contacts and a second upper contact array of the upper contacts, the upper contacts including upper intermediate portions extending between upper mating beams and upper contact tails, the upper mating beams of the upper contacts of the first and second upper contact arrays being arranged on opposite sides of the upper card slot for mating with upper and lower surfaces of the upper module circuit card, the upper contact tails positioned at the bottom of the housing for termination to the host circuit board;
    the lower contact set having a first lower contact array of the lower contacts and a second lower contact array of the lower contacts, the lower contacts including lower intermediate portions extending between lower mating beams and lower contact tails, the lower mating beams of the lower contacts of the first and second lower contact arrays being arranged on opposite sides of the lower card slot for mating with upper and lower surfaces of the lower module circuit card, the lower contact tails positioned at the bottom of the housing for termination to the host circuit board;
    wherein the upper contact tails and the lower contact tails are coplanar for surface mounting to the host circuit board.

2. The card edge connector of claim 1, wherein the upper contact tails of the first upper contact array are rearward facing and the lower contact tails of the second lower contact array are forward facing.

3. The card edge connector of claim 2, wherein the lower contact tails of the first lower contact array are rearward facing.

4. The card edge connector of claim 1, wherein the upper contacts include upper high speed transmit contacts, upper high speed receive contacts, upper low speed sideband contacts, and upper ground contacts, and wherein the lower contacts including lower high speed transmit contacts, lower high speed receive contacts, lower low speed sideband contacts, and lower ground contacts;
    wherein the upper high speed transmit contacts are arranged in pairs with the upper ground contacts arranged therebetween and the upper high speed receive contacts are arranged in pairs with the upper ground contacts arranged therebetween, and wherein the lower high speed transmit contacts are arranged in pairs with the lower ground contacts arranged therebetween and the lower high speed receive contacts are arranged in pairs with the lower ground contacts arranged therebetween; and
    wherein the upper high speed transmit contacts are provided at a first side of the contact positioner and the upper high speed receive contacts are provided at a second side of the contact positioner with at least one of the upper low speed sideband contacts located between the upper high speed transmit contacts and the upper high speed receive contacts, and wherein the lower high speed transmit contacts are provided at the second side of the contact positioner and the lower high speed receive contacts are provided at the first side of the contact positioner with at least one of the lower low speed sideband contacts located between the lower high speed transmit contacts and the lower high speed receive contacts.

5. The card edge connector of claim 1, wherein the upper contact array includes an upper front contact holder holding the upper contacts and an upper rear contact holder separate and discrete from the upper front contact holder holding the upper contacts, the upper front contact holder positioned between the upper mating beams and the upper intermediate portions of the upper contacts, the upper rear contact holder positioned between the upper intermediate portions and the upper contact tails of the upper contacts; and wherein the lower contact array includes a lower front contact holder holding the lower contacts and a lower rear contact holder separate and discrete from the lower front contact holder holding the lower contacts, the lower front contact holder positioned between the lower mating beams and the lower intermediate portions of the lower contacts, the lower rear contact holder positioned between the lower intermediate portions and the lower contact tails of the lower contacts.

6. The card edge connector of claim 5, wherein the upper intermediate portions are flexible to allow relative movement of the upper front contact holder and the upper rear contact holder, the lower intermediate portions being flexible to allow relative movement of the lower front contact holder and the lower rear contact holder.

7. The card edge connector of claim 5, wherein the upper intermediate portions are exposed to air between the upper front contact holder and the upper rear contact holder, the lower intermediate portions being exposed to air between the lower front contact holder and the lower rear contact holder.

8. The card edge connector of claim 5, wherein the contact positioner includes front slots receiving the upper front contact holder and the lower front contact holder to position the upper and lower mating beams relative to the positioner card slot, the contact positioner including rear slots receiving the upper rear contact holder and the lower rear contact holder to position the upper and lower contact tails relative to the outer housing for terminating to the host circuit board.

9. The card edge connector of claim 5, wherein the upper front contact holder includes an overmold body encasing each of the upper contacts, the upper rear contact holder includes an overmold body encasing each of the upper contacts, the lower front contact holder includes an overmold body encasing each of the lower contacts, the lower rear contact holder includes an overmold body encasing each of the lower contacts.

10. The card edge connector of claim 1, wherein the guide feature includes a dovetail, the housing including a dovetail slot receiving the dovetail to position the contact assembly in the cavity.

11. The card edge connector of claim 1, wherein the latching feature includes a deflectable latch beam.

12. The card edge connector of claim 1, wherein the contact positioner includes a platform extending between a first side wall and a second side wall, the platform separating the upper contact set from the lower contact set.

13. The card edge connector of claim 1, wherein the contact positioner includes a first side wall and a second side wall, the first side wall including slots receiving the upper contact set and the lower contact set, the second side wall including slots receiving the upper contact set and the lower contact set.

14. The card edge connector of claim 1, wherein the contact positioner includes a rear divider wall between the upper contact tails of the first upper contact array and the upper contact tails of the second upper contact array, the contact positioner including a front divider wall between the upper contact tails of the second upper contact array and the lower contact tails of the first lower contact array.

15. The card edge connector of claim 1, wherein the upper mating beams and the lower mating beams extend generally horizontally and the upper contact tails and the lower contact tails extend generally vertically.

16. A card edge connector for mating with a pluggable module comprising:
   a housing including a top and a bottom, the housing having a front and a rear, the housing having a first side and a second side, the bottom configured to be mounted to a host circuit board, the housing including a cavity, the housing including an upper card slot open to the cavity at the front of the housing and a lower card slot open to the cavity at the front of the housing, the upper card slot configured to receive a card edge of an upper module circuit card of the pluggable module, the lower card slot configured to receive a card edge of a lower module circuit card of the same pluggable module; and
   a contact assembly having a contact positioner holding an upper contact set of upper contacts and a lower contact set of lower contacts, the contact positioner received in the cavity of the housing to position the upper contacts and the lower contacts for mating with the upper module circuit card and the lower module circuit card, respectively;
   the upper contact set having a first upper contact array of the upper contacts and a second upper contact array of the upper contacts, the upper contacts including upper intermediate portions extending between upper mating beams and upper contact tails, the upper mating beams of the upper contacts of the first and second upper contact arrays being arranged on opposite sides of the upper card slot for mating with upper and lower surfaces of the upper module circuit card, the upper contact tails positioned at the bottom of the housing for termination to the host circuit board;
   the lower contact set having a first lower contact array of the lower contacts and a second lower contact array of the lower contacts, the lower contacts including lower intermediate portions extending between lower mating beams and lower contact tails, the lower mating beams of the lower contacts of the first and second lower contact arrays being arranged on opposite sides of the lower card slot for mating with upper and lower surfaces of the lower module circuit card, the lower contact tails positioned at the bottom of the housing for termination to the host circuit board;
   wherein the upper contact tails and the lower contact tails are coplanar for surface mounting to the host circuit board; and
   wherein the upper contact tails of the first upper contact array are rearward facing and the lower contact tails of the second lower contact array are forward facing.

17. The card edge connector of claim 16, wherein the upper contacts include upper high speed transmit contacts, upper high speed receive contacts, upper low speed sideband contacts, and upper ground contacts, and wherein the lower contacts including lower high speed transmit contacts, lower high speed receive contacts, lower low speed sideband contacts, and lower ground contacts;
   wherein the upper high speed transmit contacts are arranged in pairs with the upper ground contacts arranged therebetween and the upper high speed receive contacts are arranged in pairs with the upper ground contacts arranged therebetween, and wherein the lower high speed transmit contacts are arranged in pairs with the lower ground contacts arranged therebetween and the lower high speed receive contacts are arranged in pairs with the lower ground contacts arranged therebetween; and
   wherein the upper high speed transmit contacts are provided at a first side of the contact positioner and the upper high speed receive contacts are provided at a second side of the contact positioner with at least one of the upper low speed sideband contacts located between the upper high speed transmit contacts and the upper high speed receive contacts, and wherein the lower high speed transmit contacts are provided at the second side of the contact positioner and the lower high speed receive contacts are provided at the first side of the contact positioner with at least one of the lower low speed sideband contacts located between the lower high speed transmit contacts and the lower high speed receive contacts.

18. The card edge connector of claim 16, wherein the upper contact array includes an upper front contact holder holding the upper contacts and an upper rear contact holder separate and discrete from the upper front contact holder holding the upper contacts, the upper front contact holder positioned between the upper mating beams and the upper intermediate portions of the upper contacts, the upper rear contact holder positioned between the upper intermediate portions and the upper contact tails of the upper contacts; and wherein the lower contact array includes a lower front contact holder holding the lower contacts and a lower rear contact holder separate and discrete from the lower front contact holder holding the lower contacts, the lower front contact holder positioned between the lower mating beams and the lower intermediate portions of the lower contacts, the lower rear contact holder positioned between the lower intermediate portions and the lower contact tails of the lower contacts.

19. A card edge connector for mating with a pluggable module comprising:
a housing including a top and a bottom, the housing having a front and a rear, the housing having a first side and a second side, the bottom configured to be mounted to a host circuit board, the housing including a cavity, the housing including an upper card slot open to the cavity at the front of the housing and a lower card slot open to the cavity at the front of the housing, the upper card slot being separated from the lower card slot by a divider wall, the upper card slot configured to receive a card edge of an upper module circuit card of the pluggable module, the lower card slot configured to receive a card edge of a lower module circuit card of the same pluggable module; and
a contact assembly having a contact positioner holding an upper contact set of upper contacts and a lower contact set of lower contacts, the contact positioner received in the cavity of the housing to position the upper contacts and the lower contacts for mating with the upper module circuit card and the lower module circuit card, respectively, the upper contacts including upper high speed transmit contacts, upper high speed receive contacts, upper low speed sideband contacts, and upper ground contacts, the lower contacts including lower high speed transmit contacts, lower high speed receive contacts, lower low speed sideband contacts, and lower ground contacts;
the upper contact set having a first upper contact array of the upper contacts and a second upper contact array of the upper contacts, the upper contacts including upper intermediate portions extending between upper mating beams and upper contact tails, the upper mating beams of the upper contacts of the first and second upper contact arrays being arranged on opposite sides of the upper card slot for mating with upper and lower surfaces of the upper module circuit card, the upper contact tails positioned at the bottom of the housing for termination to the host circuit board;
the lower contact set having a first lower contact array of the lower contacts and a second lower contact array of the lower contacts, the lower contacts including lower intermediate portions extending between lower mating beams and lower contact tails, the lower mating beams of the lower contacts of the first and second lower contact arrays being arranged on opposite sides of the lower card slot for mating with upper and lower surfaces of the lower module circuit card, the lower contact tails positioned at the bottom of the housing for termination to the host circuit board;
wherein the upper contact tails and the lower contact tails are coplanar for surface mounting to the host circuit board;
wherein the upper high speed transmit contacts are arranged in pairs with the upper ground contacts arranged therebetween and the upper high speed receive contacts are arranged in pairs with the upper ground contacts arranged therebetween, and wherein the lower high speed transmit contacts are arranged in pairs with the lower ground contacts arranged therebetween and the lower high speed receive contacts are arranged in pairs with the lower ground contacts arranged therebetween; and
wherein the upper high speed transmit contacts are provided at a first side of the contact positioner and the upper high speed receive contacts are provided at a second side of the contact positioner with at least one of the upper low speed sideband contacts located between the upper high speed transmit contacts and the upper high speed receive contacts, and wherein the lower high speed transmit contacts are provided at the second side of the contact positioner and the lower high speed receive contacts are provided at the first side of the contact positioner with at least one of the lower low speed sideband contacts located between the lower high speed transmit contacts and the lower high speed receive contacts.

20. The card edge connector of claim 19, wherein the upper contact tails of the first upper contact array are rearward facing and the lower contact tails of the second lower contact array are forward facing.

21. The card edge connector of claim 19, wherein the upper contact array includes an upper front contact holder holding the upper contacts and an upper rear contact holder separate and discrete from the upper front contact holder holding the upper contacts, the upper front contact holder positioned between the upper mating beams and the upper intermediate portions of the upper contacts, the upper rear contact holder positioned between the upper intermediate portions and the upper contact tails of the upper contacts; and wherein the lower contact array includes a lower front contact holder holding the lower contacts and a lower rear contact holder separate and discrete from the lower front contact holder holding the lower contacts, the lower front contact holder positioned between the lower mating beams and the lower intermediate portions of the lower contacts, the lower rear contact holder positioned between the lower intermediate portions and the lower contact tails of the lower contacts.

* * * * *